(12) United States Patent
Chuang

(10) Patent No.: US 12,543,302 B2
(45) Date of Patent: Feb. 3, 2026

(54) MEMORY DEVICE HAVING PLANARIZED FINS AND METHOD OF MANUFACTURING THE SAME

(71) Applicant: NANYA TECHNOLOGY CORPORATION, New Taipei (TW)

(72) Inventor: Ying-Cheng Chuang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 475 days.

(21) Appl. No.: 18/131,962

(22) Filed: Apr. 7, 2023

(65) Prior Publication Data

US 2024/0341077 A1    Oct. 10, 2024

(51) Int. Cl.
  *H10B 12/00*    (2023.01)
(52) U.S. Cl.
  CPC .......... *H10B 12/053* (2023.02); *H10B 12/34* (2023.02)
(58) Field of Classification Search
  CPC .... H10B 12/053; H10B 12/34; H10B 12/488; H10B 12/01; H10D 64/01; H10D 64/513; H01L 29/42336; H01L 29/42352; H01L 29/4236; H01L 29/66704; H01L 29/66734; H01L 29/7397; H01L 29/7813; H01L 29/7825
  See application file for complete search history.

(56) References Cited

U.S. PATENT DOCUMENTS

| | | | | |
|---|---|---|---|---|
| 6,413,835 | B1 * | 7/2002 | Norstrom | H01L 21/76232 257/E21.549 |
| 2006/0009024 | A1 * | 1/2006 | Lee | H01L 21/31138 438/618 |
| 2019/0259839 | A1 * | 8/2019 | Ryu | H01L 21/324 |
| 2023/0335491 | A1 * | 10/2023 | Tung | H01L 21/76224 |

FOREIGN PATENT DOCUMENTS

| | | |
|---|---|---|
| TW | 201330266 A | 7/2013 |
| TW | 202036904 A | 10/2020 |

(Continued)

OTHER PUBLICATIONS

Office Action and and the search report mailed on Jan. 20, 2025 related to Taiwanese Application No. 113108166.

(Continued)

*Primary Examiner* — Thomas K Pham
(74) *Attorney, Agent, or Firm* — Xuan Zhang

(57) ABSTRACT

The present disclosure provides a memory device and a method of manufacturing the memory device. The memory device includes a semiconductor substrate defined with an active area and including a plurality of fins protruding from the semiconductor substrate and disposed within the active area, wherein each of the plurality of fins has a first planar top surface; a first word line extending into the semiconductor substrate and between an adjacent two of the plurality of fins, wherein the first word line includes an oxide layer conformal to surfaces of the adjacent two of the plurality of fins, a first conductive member surrounded by the oxide (Continued)

layer, and a first nitride layer disposed over the first conductive member and surrounded by the oxide layer; and an isolation extending into the semiconductor substrate and surrounding the active area.

18 Claims, 22 Drawing Sheets

(56) References Cited

FOREIGN PATENT DOCUMENTS

| TW | I738795 B | 9/2021 |
|----|-----------|--------|
| TW | 202139458 A | 10/2021 |

OTHER PUBLICATIONS

Summary translation of Office Action and and the search report mailed on Jan. 20, 2025 related to Taiwanese Application No. 113108166.
Office Action and Search Report mailed on Nov. 6, 2024 related to Taiwanese Application No. 112124735.
Office Action and Search Report mailed on May 13, 2024 related to Taiwanese Application No. 112124735.

\* cited by examiner

MEMORY DEVICE HAVING PLANARIZED FINS AND METHOD OF MANUFACTURING THE SAME

TECHNICAL FIELD

The present disclosure relates to a memory device and a manufacturing method thereof, and more particularly, to a memory device having planarized fins over a substrate and a manufacturing method of the memory device.

DISCUSSION OF THE BACKGROUND

Dynamic random-access memory (DRAM) is a type of semiconductor arrangement for storing bits of data in separate capacitors within an integrated circuit (IC). DRAMs are commonly formed as trench capacitor DRAM cells. An advanced method of fabricating a buried gate electrode involves building a gate electrode of a transistor and a word line in a trench in an active area (AA) comprising a shallow trench isolation (STI) structure.

Over the past few decades, as semiconductor fabrication technology has continuously improved, sizes of electronic devices have been correspondingly reduced. As a size of a cell transistor is reduced to a few nanometers in length, a size of a contact between the cell transistor and the active area can become an issue. A small contact area between the cell transistor and the active area may result in a significant drop in performance of the cell transistors. It is therefore desirable to develop improvements that address related manufacturing challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for manufacturing a memory device. The method includes providing a semiconductor substrate defined with a plurality of active areas and including an isolation surrounding each of the plurality of active areas; disposing and patterning a first dielectric layer over the semiconductor substrate and the isolation; removing portions of the semiconductor substrate exposed through the first dielectric layer to form a plurality of first recesses extending into the semiconductor substrate, thereby forming a plurality of fins protruding from the semiconductor substrate; forming a second dielectric layer conformal to each of the plurality of first recesses and surrounding the plurality of fins, wherein each of the plurality of fins has a first top surface after the formation of the second dielectric layer, the first top surface being a rounded surface; forming a first conductive member within each of the plurality of first recesses and surrounded by the second dielectric layer; forming a third dielectric layer over the first conductive member and surrounded by the second dielectric layer; and removing the first dielectric layer, a portion of the second dielectric layer and the first top surfaces of the plurality of fins, thereby forming a second top surface of each of the plurality of fins, wherein the second top surface is a planar surface.

Another aspect of the present disclosure provides a method for manufacturing a memory device. The method includes providing a semiconductor substrate defined with an active area and including an isolation surrounding the active area; removing portions of the semiconductor substrate to form a plurality of fins protruding from the semiconductor substrate; forming an oxide layer surrounding each of the plurality of fins, thereby forming a rounded top surface of each of the plurality of fins; forming a conductive member surrounding the plurality of fins and surrounded by the oxide layer; forming a nitride layer over the conductive member and surrounded by the oxide layer; and removing portions of the oxide layer and the rounded top surfaces of plurality of fins, thereby forming a planar top surface of each of the plurality of fins.

Another aspect of the present disclosure provides a memory device. The memory device includes a semiconductor substrate defined with an active area and including a plurality of fins protruding from the semiconductor substrate and disposed within the active area, wherein each of the plurality of fins has a first planar top surface; a first word line extending into the semiconductor substrate and between adjacent two of the plurality of fins, wherein the first word line includes an oxide layer conformal to surfaces of the adjacent two of the plurality of fins, a first conductive member surrounded by the oxide layer, and a first nitride layer disposed over the first conductive member and surrounded by the oxide layer; and an isolation extending into the semiconductor substrate and surrounding the active area, wherein the first nitride layer has a second planar top surface substantially coplanar with the first planar top surface of each of the plurality of fins.

In conclusion, because a top portion of each of the fins protruding from a substrate is planarized prior to a formation of a contact between a cell capacitor and each fin, a contact area between the cell capacitor and each fin is enlarged, and a curved surface of the top portion becomes a planar surface. Therefore, an overall performance of a memory device and a process of manufacturing the memory device are improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
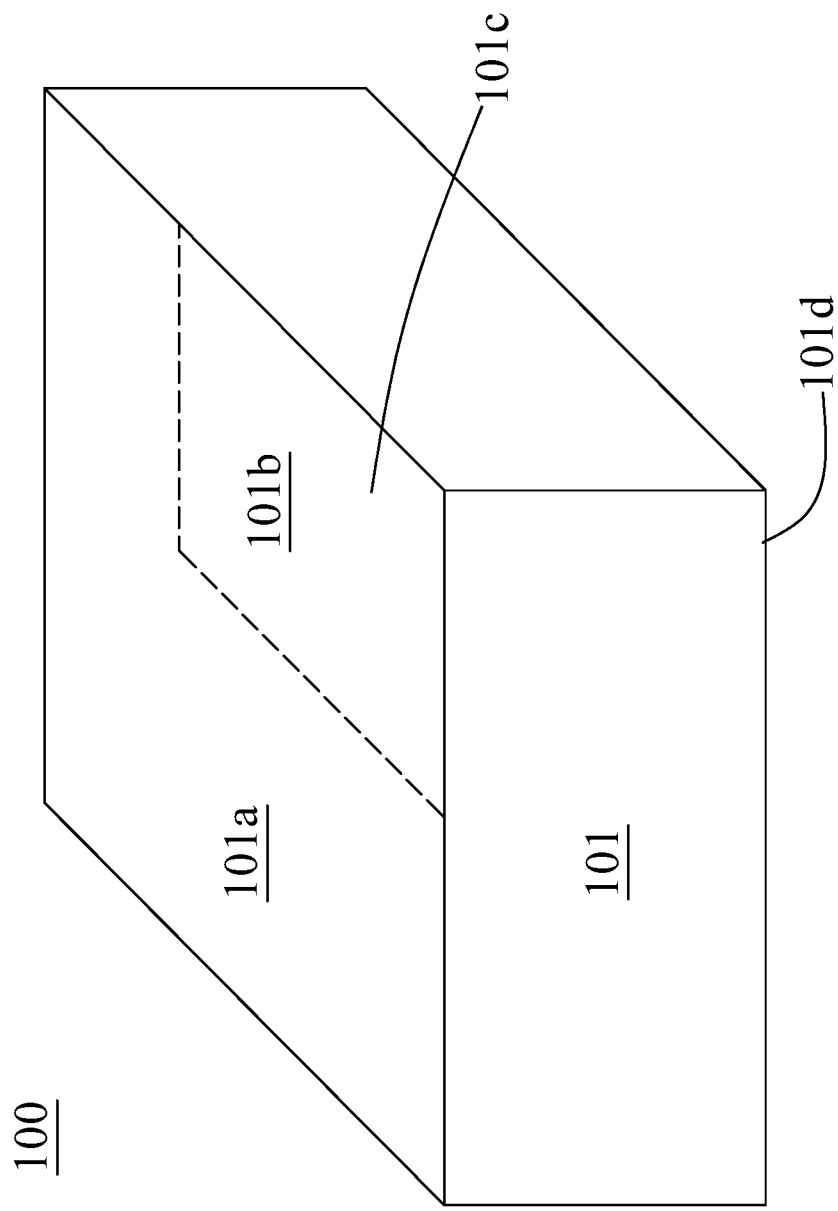
FIG. 1 is a perspective view of a memory device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic perspective view of a memory device 100 in accordance with some embodiments of the present disclosure. In some embodiments, the memory device 100 includes several unit cells arranged in rows and columns.

Referring to FIG. 1, the memory device 100 includes a semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes a peripheral region 101a and an array area 101b at least partially surrounded by the peripheral region 101a. In some embodiments, the peripheral region 101a is adjacent to a periphery of the semiconductor substrate 101, and the array area 101b is adjacent to a central area of the semiconductor substrate 101. In some embodiments, the array area 101b may be used for fabricating transistors, capacitors or the like.

Figure 2:
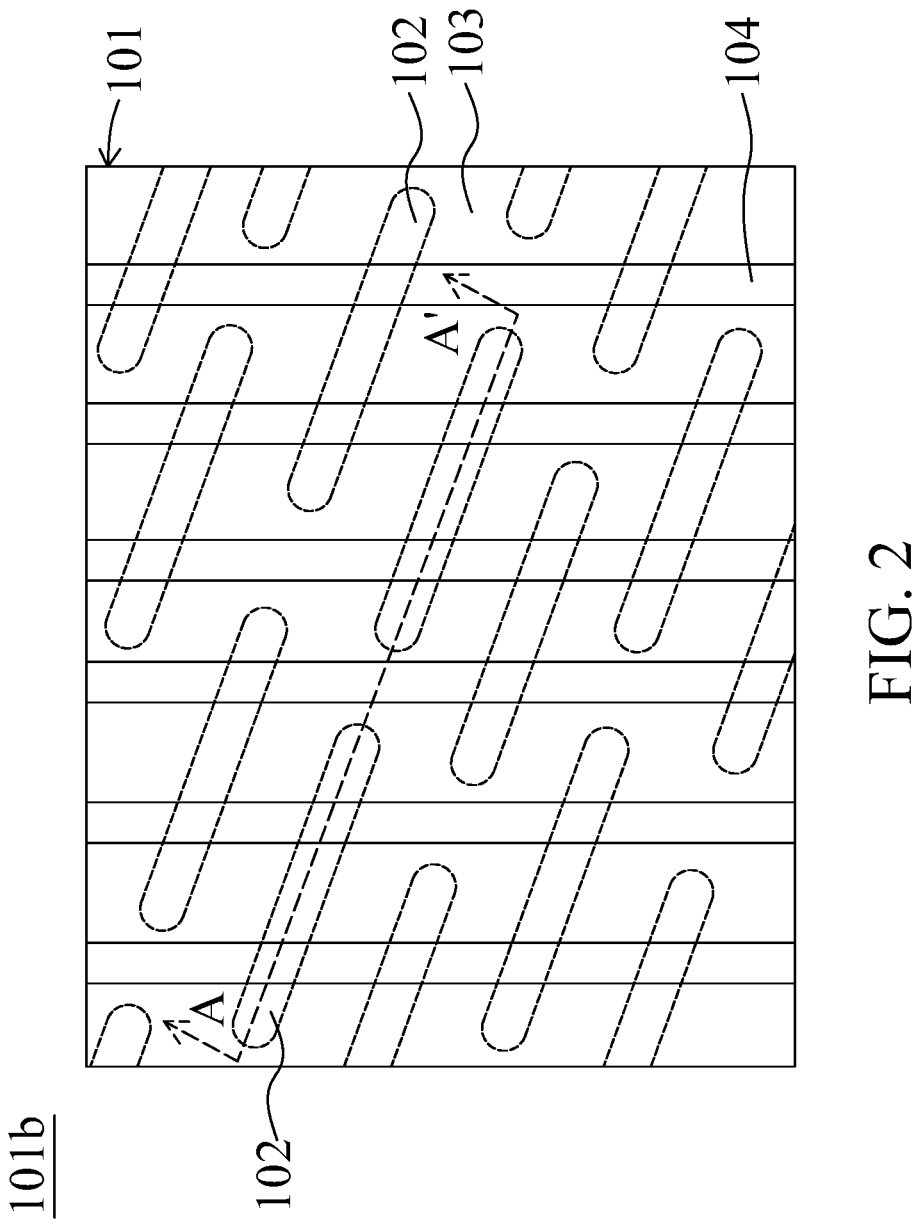
FIG. 2 is a top view of the memory device of FIG. 1.

In some embodiments, the semiconductor substrate 101 includes a first surface 101c and a second surface 101d opposite to the first surface 101c. In some embodiments, the first surface 101c is a front side of the semiconductor substrate 101, wherein electrical devices or components are subsequently formed over the first surface 101c and configured to electrically connect to an external circuitry. In some embodiments, the second surface 101d is a back side of the substrate 101, where electrical devices or components are absent. FIG. 2 is a schematic top view of the array area 101b of the semiconductor substrate 101 of FIG. 1. Referring to FIG. 2, the semiconductor substrate 101 includes several active areas (AA) 102. In some embodiments, the active area 102 is a doped region in the semiconductor substrate 101. In some embodiments, the active area 102 extends horizontally over or under the first surface 101c of the semiconductor substrate 101. In some embodiments, each of the active areas 102 includes a same type of dopant. In some embodiments, each of the active areas 102 includes a type of dopant that is different from types of dopants included in other active areas 102. In some embodiments, each of the active areas 102 has a same conductivity type. In some embodiments, the active area 102 includes n-type dopants.

In some embodiments, the memory device 100 includes an isolation 103 extending into the semiconductor substrate 101 and surrounding the active areas 102. In some embodiments, the isolation 103 extends from the first surface 101c toward the second surface 101d of the semiconductor substrate 101. In some embodiments, the isolation 103 is a shallow trench isolation (STI). In some embodiments, the isolation 103 defines a boundary of each of the active areas 102. In some embodiments, the isolation 103 is formed of an insulating material, such as silicon oxide, silicon nitride, silicon oxynitride, the like, or a combination thereof.

Figure 3:
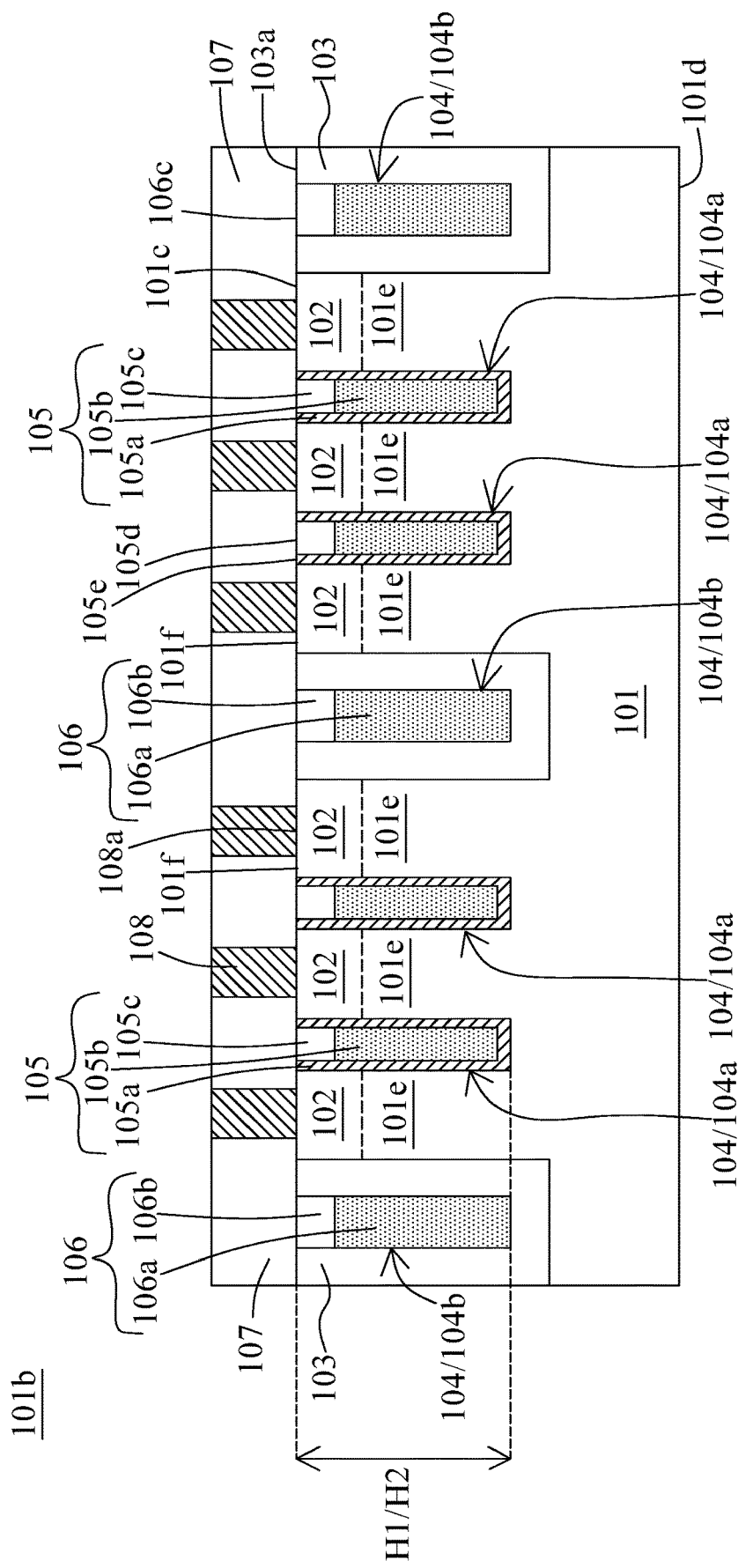
FIG. 3 is a cross-sectional view of a portion of the memory device along a line A-A' in FIG. 2.

FIG. 3 is a schematic cross-sectional view of the memory device 100 along a line A-A' in FIG. 2. Referring to FIG. 2 and FIG. 3, several recesses 104 are formed over the array area 101b of the semiconductor substrate 101 and across the active areas 102 and the isolation 103. In some embodiments, the recesses 104 include a first recess 104a extending into the semiconductor substrate 101 and a second recess 104b extending into the isolation 103. In some embodiments, the first recess 104a extends across one or more of the active areas 102. In some embodiments, the first recess 104a and the second recess 104b have a same depth. In some embodiments, the first recess 104a is shallower than the second recess 104b.

Referring to FIG. 3, several fins 101e protrude from the semiconductor substrate 101. In some embodiments, the fin 101e protrudes from the second surface 101d toward the first surface 101c. In some embodiments, the fins 101e and the first recesses 104a are alternately disposed. In some embodiments, a top portion of the fin 101e is the active area 102 of the semiconductor substrate 101. In some embodiments, each of the fins 101e has a first top surface 101f as shown in FIG. 3. In some embodiments, the first top surface 101f of the fin 101e is a planar or flat surface.

In some embodiments, the memory device 100 includes a first word line 105 within the first recess 104a as shown in FIG. 3. The first word line 105 extends into the semiconductor substrate 101. In some embodiments, the first word line 105 is disposed between an adjacent two of the fins 101e. In some embodiments, at least a portion of the first word line 105 is surrounded by the active areas 102.

In some embodiments, the first word line 105 includes an oxide layer 105a, a first conductive member 105b and a first nitride layer 105c. In some embodiments, the oxide layer 105a is disposed conformal to a sidewall of the first recess 104a. In some embodiments, the oxide layer 105a is conformal to surfaces of the adjacent two of fins 101e. In some embodiments, the oxide layer 105a contacts an entire sidewall of the first recess 104a. In some embodiments, the oxide layer 105a is formed of an insulating material, such as silicon oxide, silicon nitride, silicon oxynitride, the like, or a combination thereof. In some embodiments, the oxide layer 105a includes dielectric material with a low dielectric constant (low k).

In some embodiments, the first conductive member 105b is disposed within the first recess 104a and surrounded by the oxide layer 105a. In some embodiments, the first conductive member 105b is isolated from the fins 101e by the oxide layer 105a. In some embodiments, the first conductive member 105b includes conductive material such as tungsten (W).

In some embodiments, the first nitride layer 105c is disposed within the first recess 104a and over the first conductive member 105b and surrounded by the oxide layer 105a. In some embodiments, the first nitride layer 105c is formed of an insulating material, such as silicon nitride, silicon oxynitride, the like, or a combination thereof. In some embodiments, the first nitride layer 105c has a second top surface 105d substantially coplanar with the first top surface 101f of the fin 101e. In some embodiments, the second top surface 105d of the first nitride layer 105c is a planar or flat surface.

In some embodiments, the oxide layer 105a has a third top surface 105e substantially coplanar with the first top surface 101f of the fin 101e and the second top surface 105d of the first nitride layer 105c. In some embodiments, the third top surface 105e of the oxide layer 105a is a planar or flat surface. In some embodiments, the third top surface 105e of the oxide layer 105a is coupled with the first top surface 101f of the fin 101e and the second top surface 105d of the first nitride layer 105c.

In some embodiments, the isolation 103 has a fourth top surface 103a substantially coplanar with the first top surface 101f of the fin 101e, the second top surface 105d of the first nitride layer 105c and the third top surface 105e of the oxide layer 105a. In some embodiments, the fourth top surface 103a is a planar or flat surface.

In some embodiments, the memory device 100 includes a second word line 106 within the second recess 104b as shown in FIG. 3. In some embodiments, the second word line 106 is surrounded by the isolation 103. In some embodiments, the second word line 106 is separated from the first word line 105 by the fins 101e. In some embodiments, a height H1 of the first word line 105 is substantially same as a height H2 of the second word line 106. In some embodiments, the height H1 of the first word line 105 is substantially less than the height H2 of the second word line 106.

In some embodiments, the second word line 106 includes a second conductive member 106a within the second recess 104b and a second nitride layer 106b above the second conductive member 106a and within the second recess 104b. In some embodiments, the second conductive member 106a includes conductive material such as tungsten (W). In some embodiments, the second nitride layer 106b is formed of an insulating material, such as silicon nitride, silicon oxynitride, the like, or a combination thereof.

In some embodiments, the second nitride layer 106b has a fifth top surface 106c substantially coplanar with the first top surface 101f of the fin 101e, the second top surface 105d of the first nitride layer 105c, the third top surface 105e of the oxide layer 105a and the fourth top surface 103a of the isolation 103. In some embodiments, the fifth top surface 106c of the second nitride layer 106b is a planar or flat surface. In some embodiments, the fifth top surface 106c of the second nitride layer 106b is coupled with the fourth top surface 103a of the isolation 103.

Referring to FIG. 3, the memory device 100 further includes an insulating layer 107 over the semiconductor substrate 101 and the isolation 103, and a conductive plug 108 extending through the insulating layer 107. In some embodiments, the insulating layer 107 covers the isolation 103, the second word line 106, the first word line 105 and at least a portion of the fin 101e. In some embodiments, the insulating layer 107 is formed of an insulating material, such as silicon oxide, silicon nitride, silicon oxynitride, the like, or a combination thereof.

In some embodiments, the conductive plug 108 contacts the first top surface 101f of the fin 101e. In some embodiments, an interface 108a between the conductive plug 108 and the fin 101e is a planar interface. In some embodiments, the interface 108a is disposed between the conductive plug 108 and the first top surface 101f of the fin 101e. In some embodiments, the conductive plug 108 is formed of conductive material such as copper, silver or the like. In some embodiments, the conductive plug 108 is configured to electrically connect to a capacitor disposed above the insulating layer 107.

Figure 4:
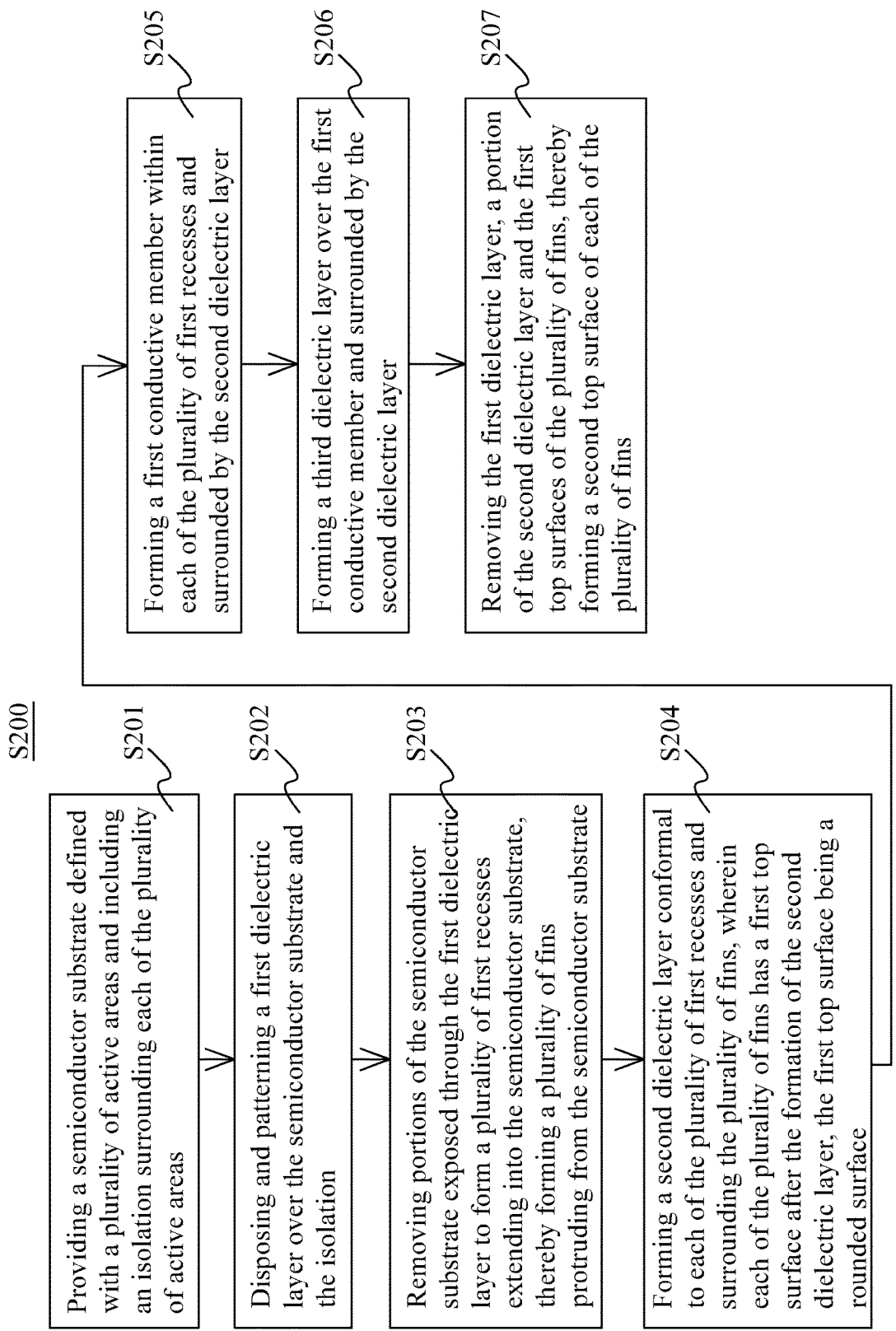
FIG. 4 is a flow diagram illustrating a method of manufacturing a memory device in accordance with some embodiments of the present disclosure.

FIG. 4 is a flow diagram illustrating a method S200 of manufacturing a memory device 100 in accordance with some embodiments of the present disclosure, and FIGS. 5 to 22 illustrate schematic views of intermediate stages in formation of the memory device 100 in accordance with some embodiments of the present disclosure.

The stages shown in FIGS. 5 to 22 are also illustrated schematically in the flow diagram in FIG. 4. In following discussion, the fabrication stages shown in FIGS. 5 to 22 are discussed in reference to process steps shown in FIG. 4. The method S200 includes a number of operations, and description and illustration are not deemed as a limitation to a sequence of the operations. The method S200 includes a number of steps (S201, S202, S203, S204, S205, S206 and S207).

In some embodiments, the method S200 includes providing a semiconductor substrate defined with a plurality of active areas and including an isolation surrounding each of the plurality of active areas (S201); disposing and patterning a first dielectric layer over the semiconductor substrate and the isolation (S202); removing portions of the semiconductor substrate exposed through the first dielectric layer to form a plurality of first recesses extending into the semiconductor substrate, thereby forming a plurality of fins protruding from the semiconductor substrate (S203); forming a second dielectric layer conformal to each of the plurality of first recesses and surrounding the plurality of fins, wherein each of the plurality of fins has a first top surface after the formation of the second dielectric layer, the first top surface being a rounded surface (S204); forming a first conductive member within each of the plurality of first recesses and surrounded by the second dielectric layer (S205); forming a third dielectric layer over the first conductive member and surrounded by the second dielectric layer (S206); and removing the first dielectric layer, a portion of the second dielectric layer and the first top surfaces of the plurality of fins, thereby forming a second top surface of each of the plurality of fins, wherein the second top surface is a planar surface (S207).

Figure 5:
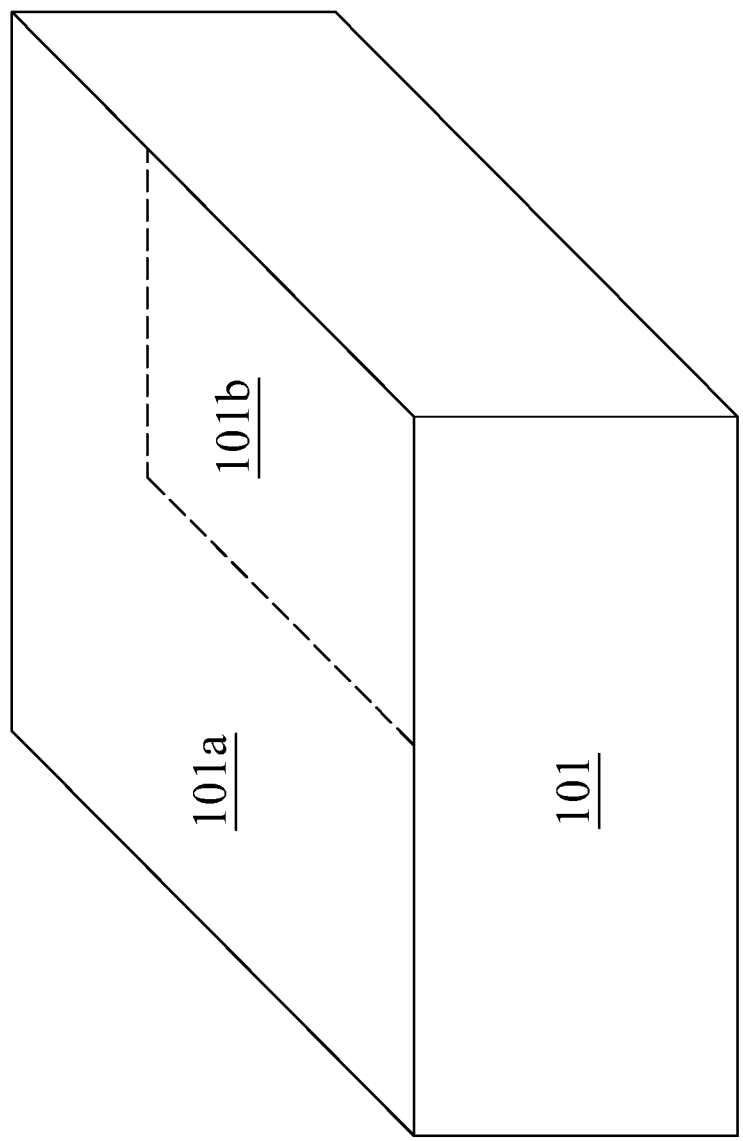
FIGS. 5 to 22 illustrate cross-sectional views of intermediate stages in the formation of a memory device in accordance with some embodiments of the present disclosure.

Referring to FIG. 5, a semiconductor substrate 101 is provided according to step S201 in FIG. 4. In some embodiments, the semiconductor substrate 101 includes semiconductive material such as silicon, germanium, gallium, arsenic, or a combination thereof. In some embodiments, the semiconductor substrate 101 includes bulk semiconductor material. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate.

In some embodiments, the semiconductor substrate 101 includes a peripheral region 101a and an array area 101b at least partially surrounded by the peripheral region 101a. In some embodiments, the peripheral region 101a is adjacent to a periphery of the semiconductor substrate 101, and the array area 101b is adjacent to a central area of the semiconductor substrate 101. In some embodiments, the array area 101b may be used for fabricating transistors, capacitors or the like.

Figure 6:
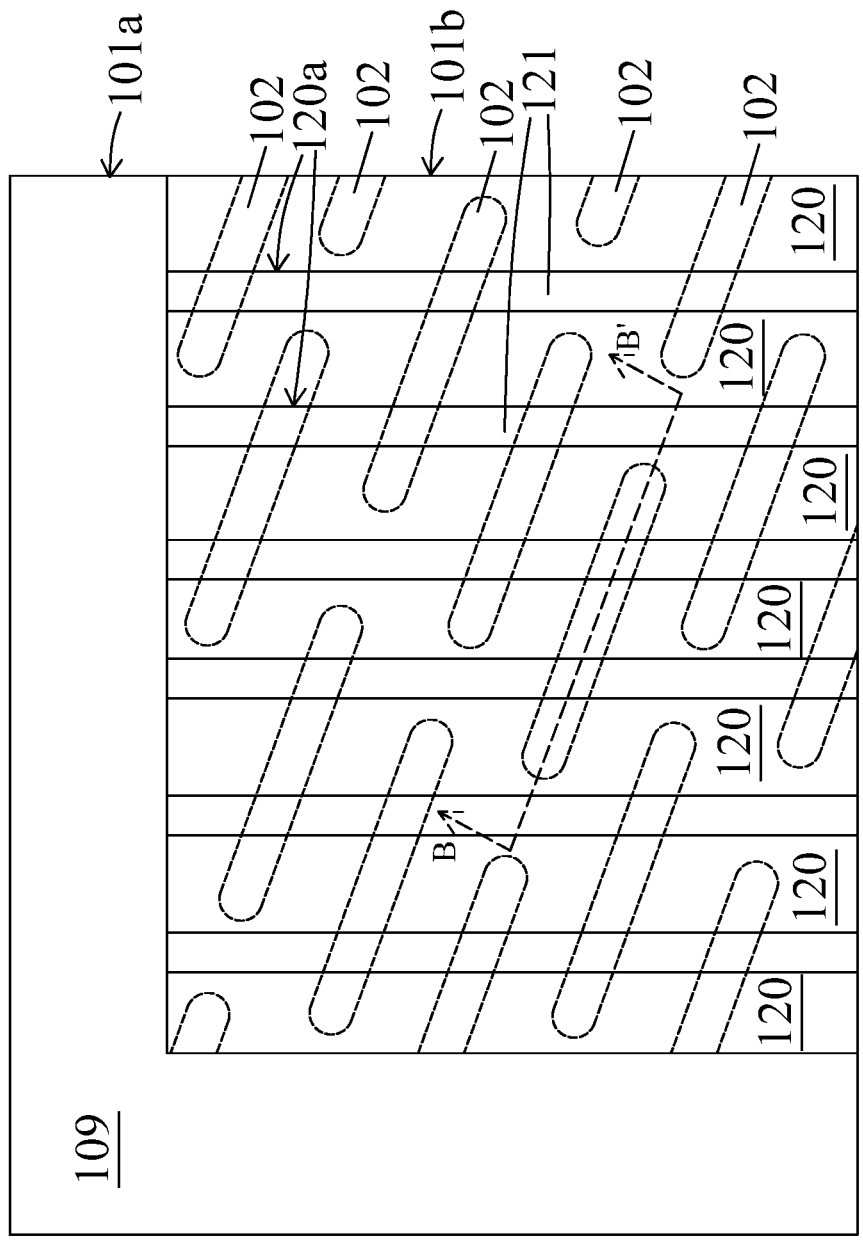

FIG. 6 is a schematic top view of the semiconductor substrate 101 of FIG. 5. In some embodiments, the peripheral region 101a is covered by a peripheral photoresist 109 as shown in FIG. 6. In some embodiments, the peripheral photoresist 109 is configured to protect components in the peripheral region 101a. In some embodiments, the array area 101b is exposed through the peripheral photoresist 109 as shown in FIG. 6.

Figure 7:
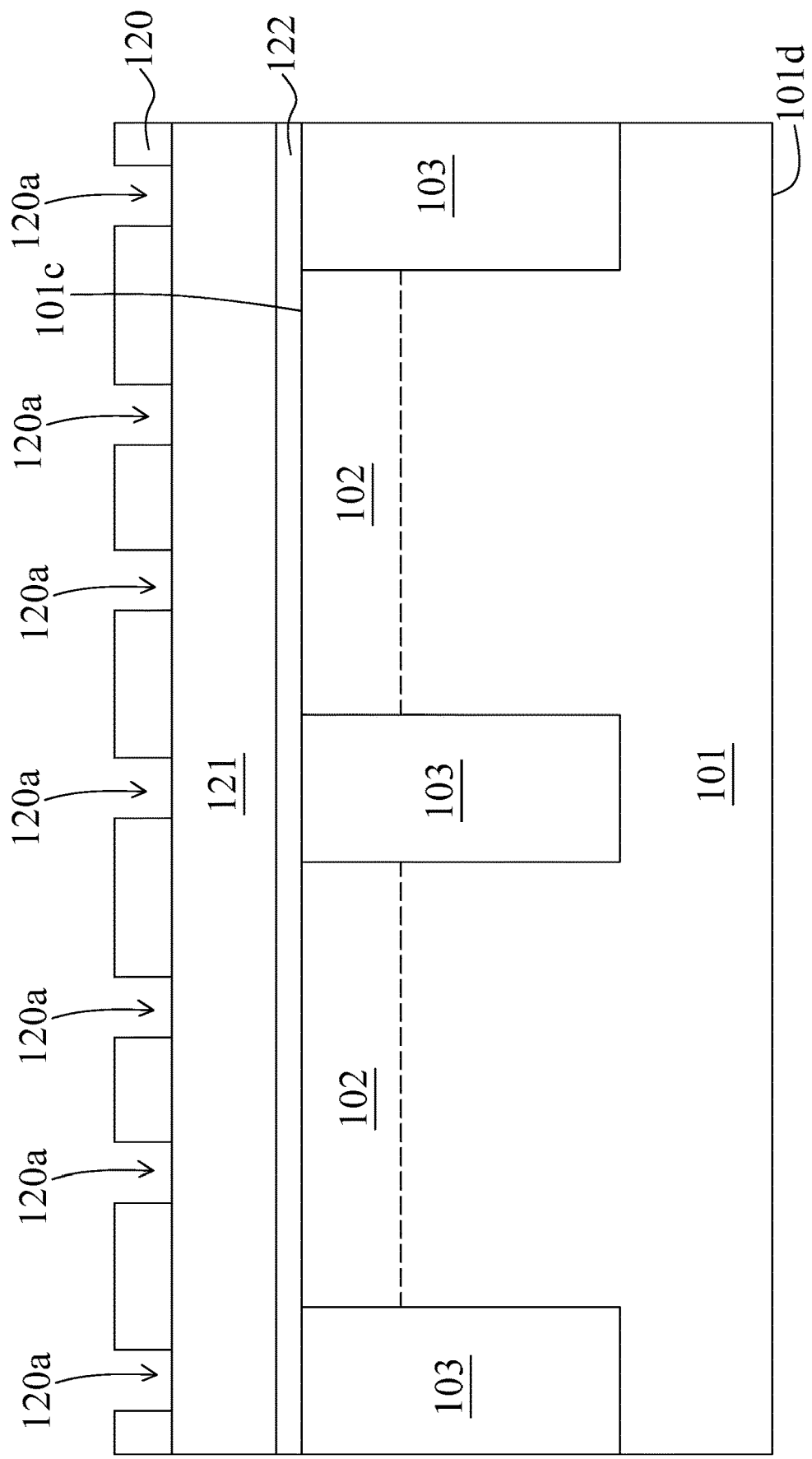

FIG. 7 is a schematic cross-sectional view of a portion of the array area 101b along a line B-B' in FIG. 6. In some embodiments, the semiconductor substrate 101 includes several active areas (AA) 102. In some embodiments, the active area 102 is a doped region in the semiconductor substrate 101. In some embodiments, each of the active areas 102 includes a same type of dopant. In some embodiments, each of the active areas 102 includes a type of dopant that is different from types of dopants included in other active areas 102. In some embodiments, each of the active areas 102 has a same conductivity type.

In some embodiments, an isolation 103 extends into the semiconductor substrate 101 and surrounds the active area 102. In some embodiments, the isolation 103 is a shallow trench isolation (STI). In some embodiments, the isolation 103 defines a boundary of one of the active areas 102. In some embodiments, the isolation 103 is formed of an insulating material, such as silicon oxide, silicon nitride, silicon oxynitride, the like, or a combination thereof.

In some embodiments, according to step S202 in FIG. 4, a first dielectric layer 122 is disposed over the semiconductor substrate 101 and the isolation 103. In some embodiments, the first dielectric layer 122 is disposed by deposition, chemical vapor deposition (CVD) or any other suitable process. Next, in some embodiments, the first dielectric layer 122 is covered by several mask layers as shown in FIG. 7. In some embodiments, the mask layers include a second mask layer 121 over the first dielectric layer 122 and a first mask layer 120 over the second mask layer 121. In some embodiments, the first mask layer 120 includes insulating material such as oxide or the like. In some embodiments, the first mask layer 120 includes silicon dioxide. In some embodiments, the first mask layer 120 includes several first trenches 120a cutting through the first mask layer 120 and extending over the semiconductor substrate 101 and the isolation 103. In some embodiments, the second mask layer 121 is at least partially exposed through the first mask layer 120. In some embodiments, the second mask layer 121 includes carbon or the like.

Figure 8:
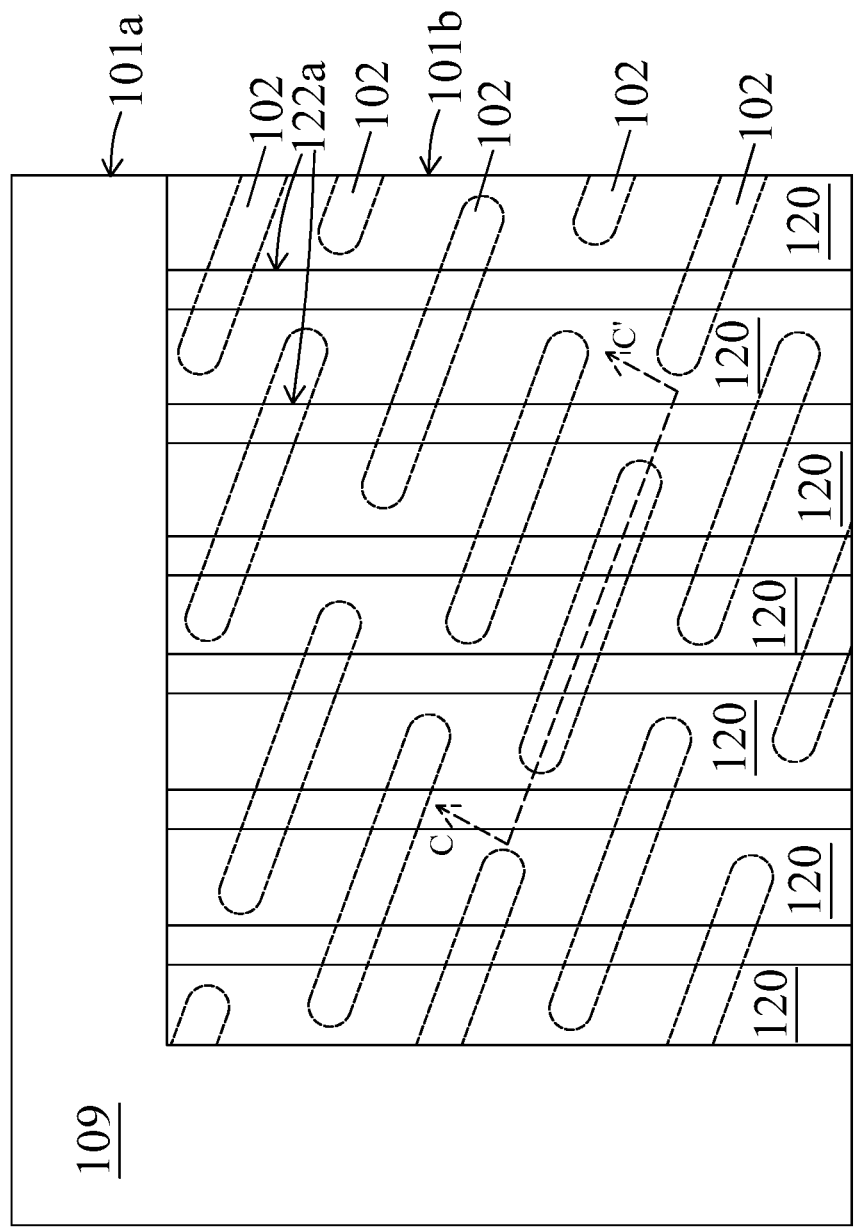
Figure 9:
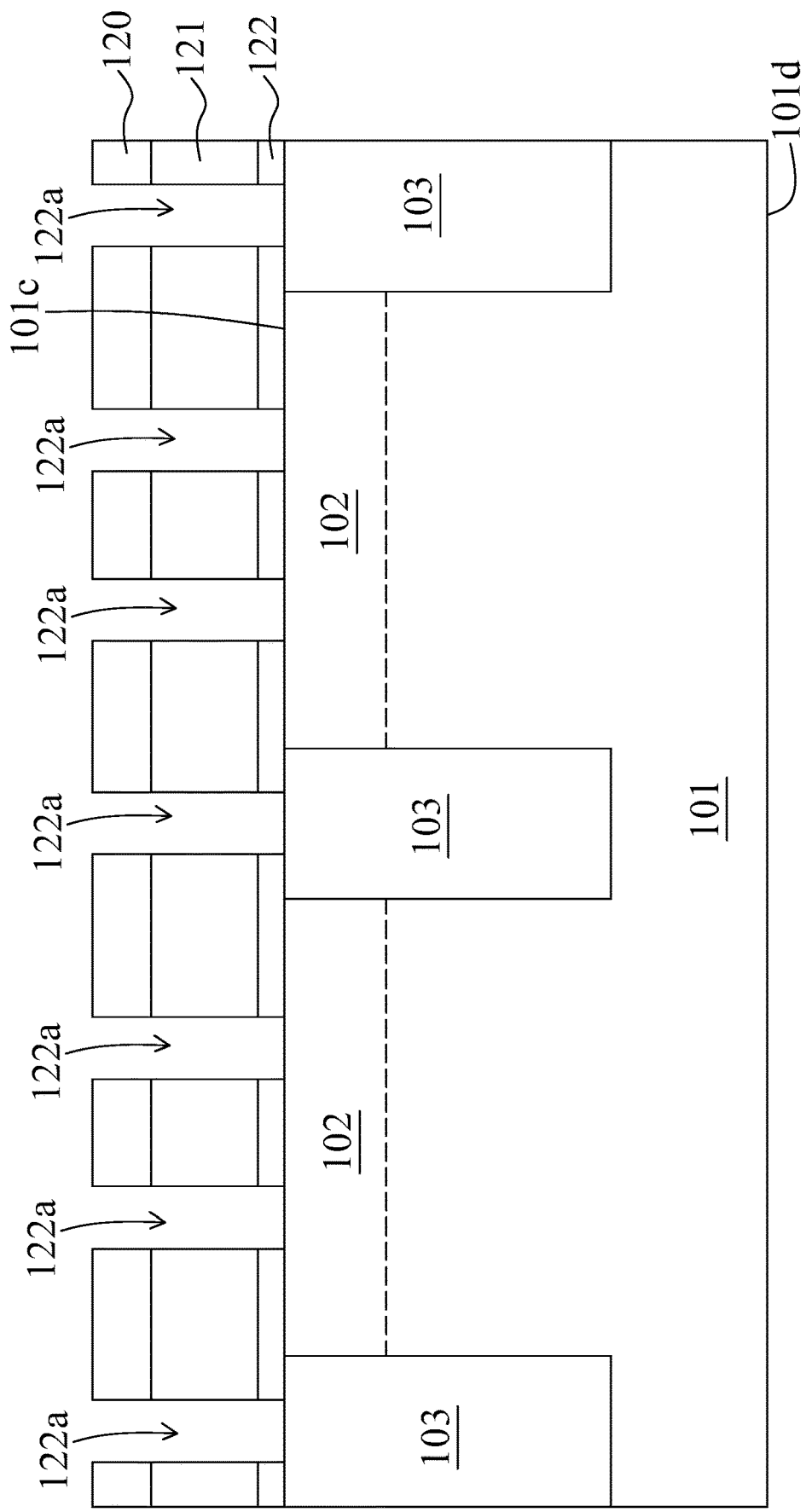
Figure 10:
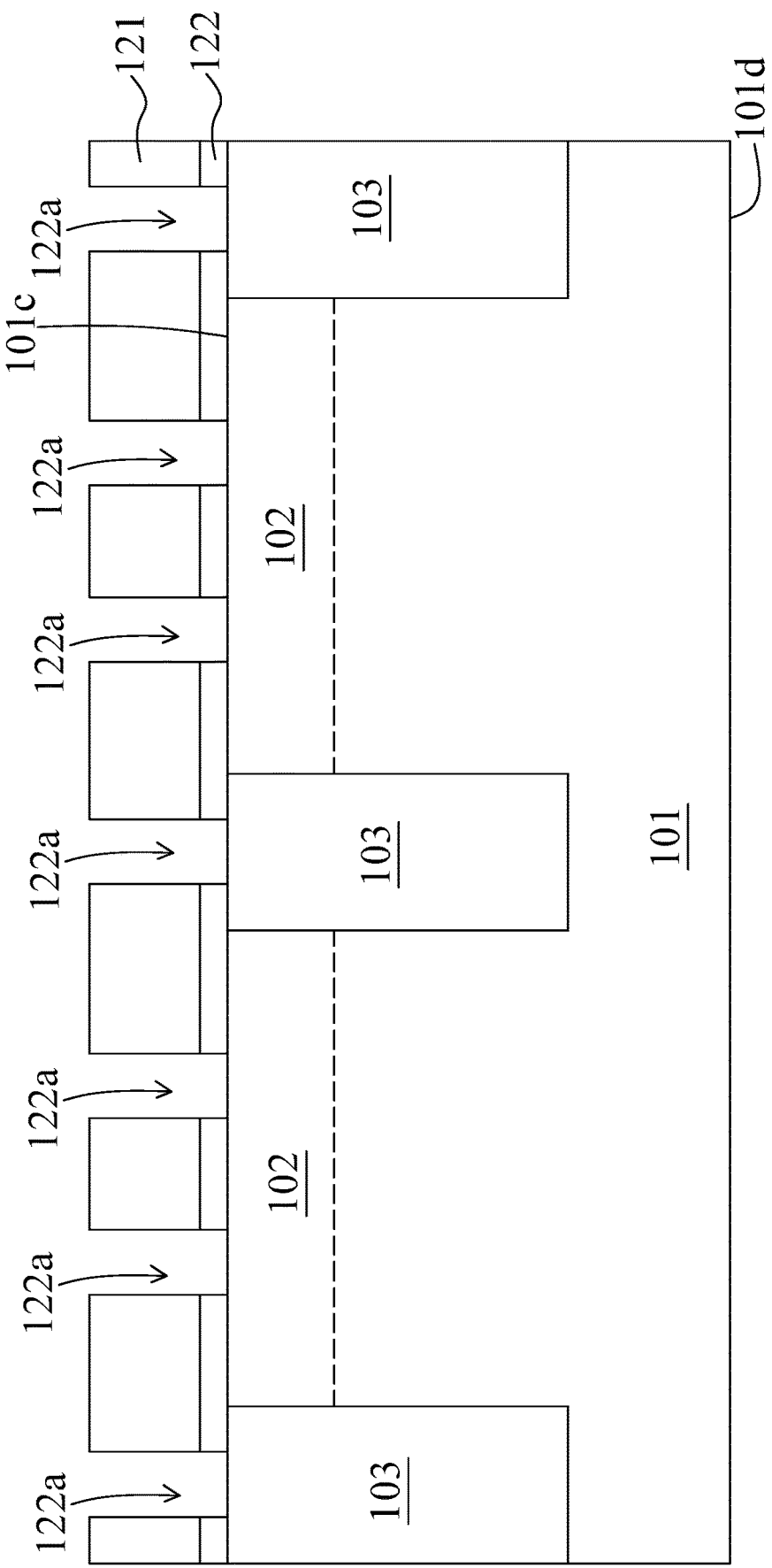

Next, as shown in FIGS. 8 and 9, the first dielectric layer 122 is patterned. In some embodiments, portions of the first dielectric layer 122 and the second mask layer 121 exposed through the first mask layer 120 are removed to form several second trenches 122a as shown in FIGS. 8 and 9. FIG. 8 is a schematic top view of the peripheral region 101a and the array area 101b after the formation of the second trenches 122a, and FIG. 9 is a schematic cross-sectional view along a line C-C' in FIG. 8. In some embodiments, the isolation 103 and the active areas 102 are at least partially exposed by the second trenches 122a. After the formation of the second trenches 122a, the first mask layer 120 is removed as shown in FIG. 10.

Figure 11:
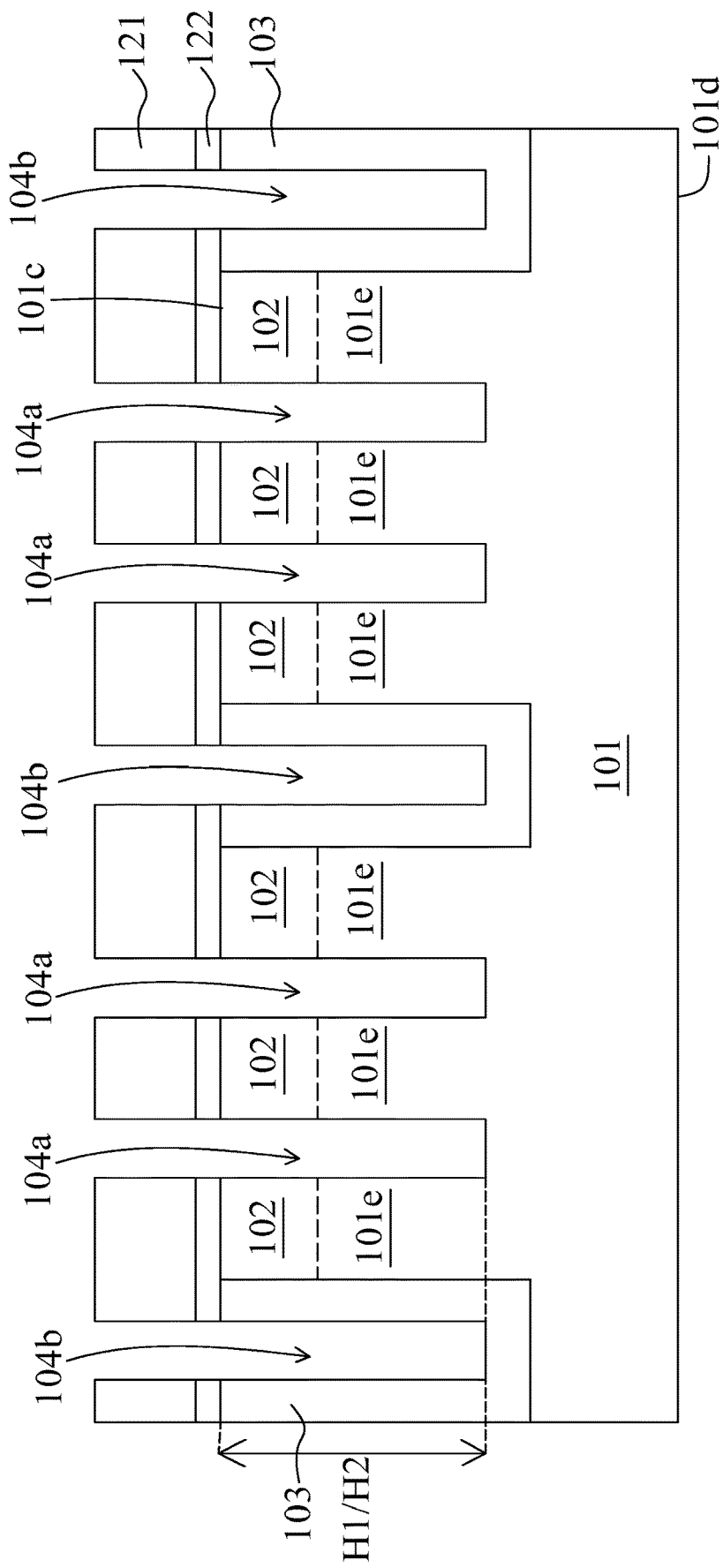

Referring to FIG. 11, portions of the semiconductor substrate 101 exposed through the first dielectric layer 122 and the second mask layer 121 are removed to form several first recesses 104a according to step S203 in FIG. 4. In some embodiments, the portions of the semiconductor substrate 101 are removed by dry etching or any other suitable process. In some embodiments, the first recess 104a extends into the semiconductor substrate 101, so that several fins 101e protruding from the semiconductor substrate 101 are formed. In some embodiments, the fins 101e and the first recesses 104a are alternately disposed.

In some embodiments, portions of the isolation 103 exposed through the first dielectric layer 122 and the second mask layer 121 are removed to form several second recesses 104b as shown in FIG. 11. In some embodiments, the second recess 104b extends into the isolation 103. In some embodiments, the portions of the isolation 103 are removed by dry etching or any other suitable process. In some embodiments, the first recesses 104a and the second recesses 104b are alternately disposed. In some embodiments, a height H1 of the first recess 104a is substantially same as a height H2 of the second recess 104b. In some embodiments, the height H1 of the first recess 104a is substantially less than the height H2 of the second recess 104b. In some embodiments, the first recesses 104a and the second recesses 104b are formed simultaneously or sequentially.

Figure 12:
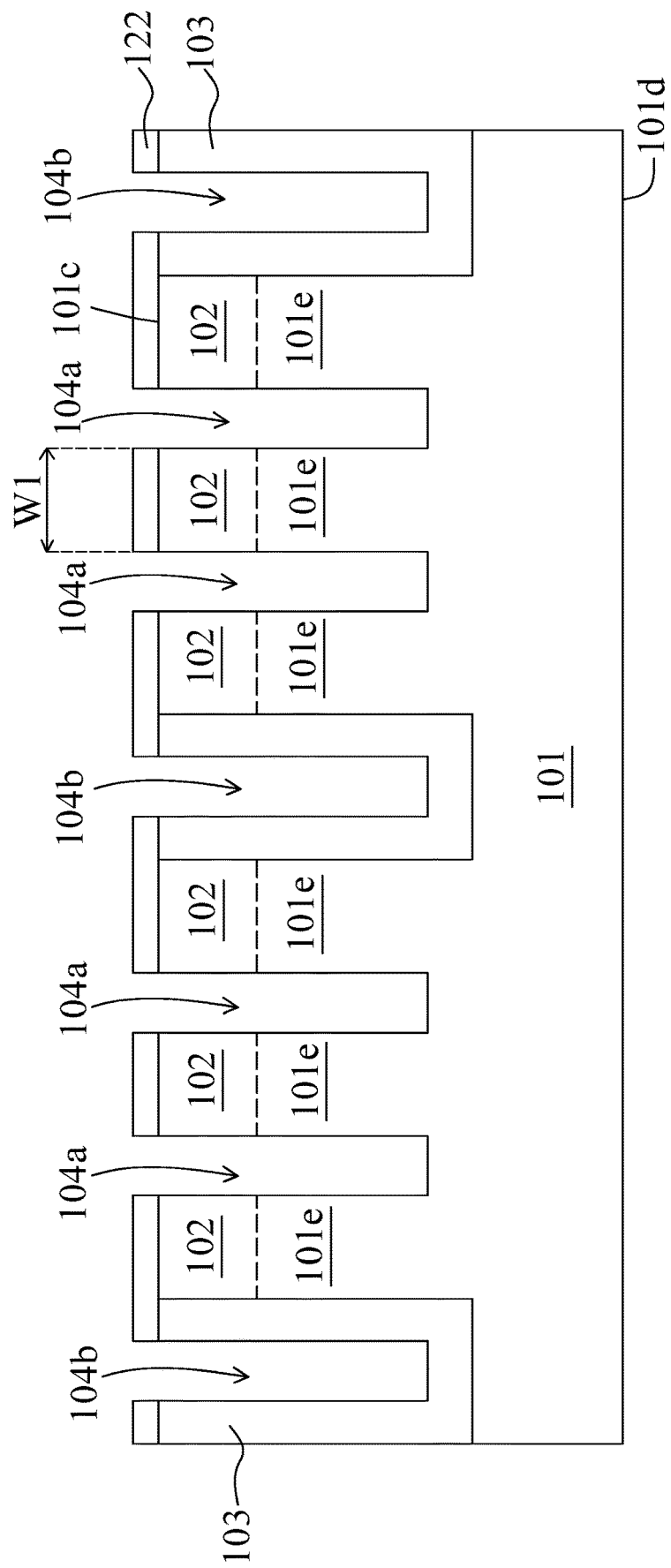

In some embodiments, the second mask layer 121 is removed after the formation of the first recesses 104a as shown in FIG. 12. In some embodiments, the second mask layer 121 is removed after the formation of the second recesses 104b. In some embodiments, the second mask layer 121 is removed by etching or any other suitable process.

Figure 13:
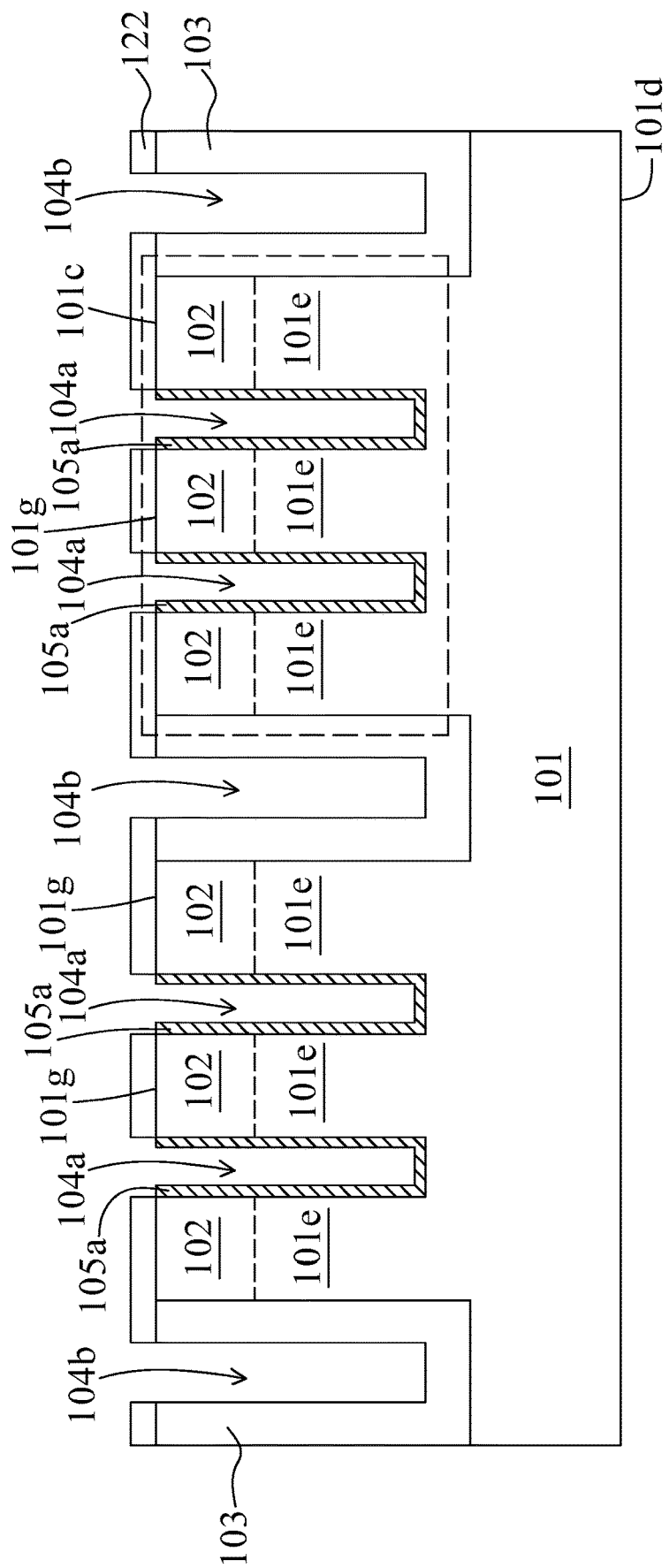

Referring to FIG. 13, a second dielectric layer 105a is formed according to step S204 in FIG. 4. In some embodiments, the second dielectric layer 105a is conformal to the first recess 104a and is surrounded by the fins 101e. In some embodiments, the second dielectric layer 105a is formed on a bottom and sidewalls of the first recess 104a. In some embodiments, the second dielectric layer 105a is formed by thermal oxidation or any other suitable process. In some embodiments, the formation of the second dielectric layer 105a includes consuming a surface of the fin 101e exposed through the first recess 104a. In some embodiments, a width W1 of the fin 101e (as shown in FIG. 12) is reduced after the formation of the second dielectric layer 105a. In some embodiments, the second dielectric layer 105a is an oxide layer. In some embodiments, the second dielectric layer 105a is a silicon dioxide layer.

Figure 14:
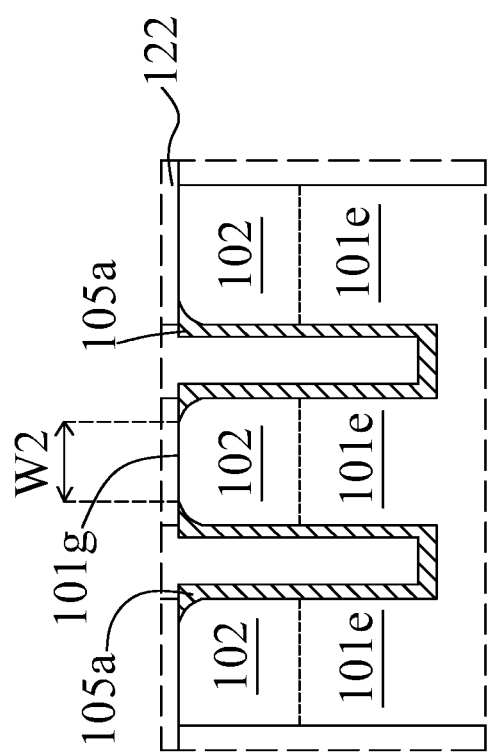

In some embodiments, a rounded top surface 101g of the fin 101e is formed after the formation of the second dielectric layer 105a as shown in FIG. 14. FIG. 14 is an enlarged view of a portion enclosed by dashed lines in FIG. 13. In some embodiments, the rounded top surface 101g is a convex surface. In some embodiments, the rounded top surface 101g is curved toward the first dielectric layer 122. In some embodiments, a portion of the second dielectric layer 105a is disposed between the first dielectric layer 122 and the rounded top surface 101g of the fin 101e. In some embodiments, the second dielectric layer 105a contacts portions of the fins 101e exposed through the first recesses 104a. In some embodiments, the rounded top surface 101g contacting the first dielectric layer 122 has a width W2 substantially less than the width W1 of the fin 101e.

Figure 15:
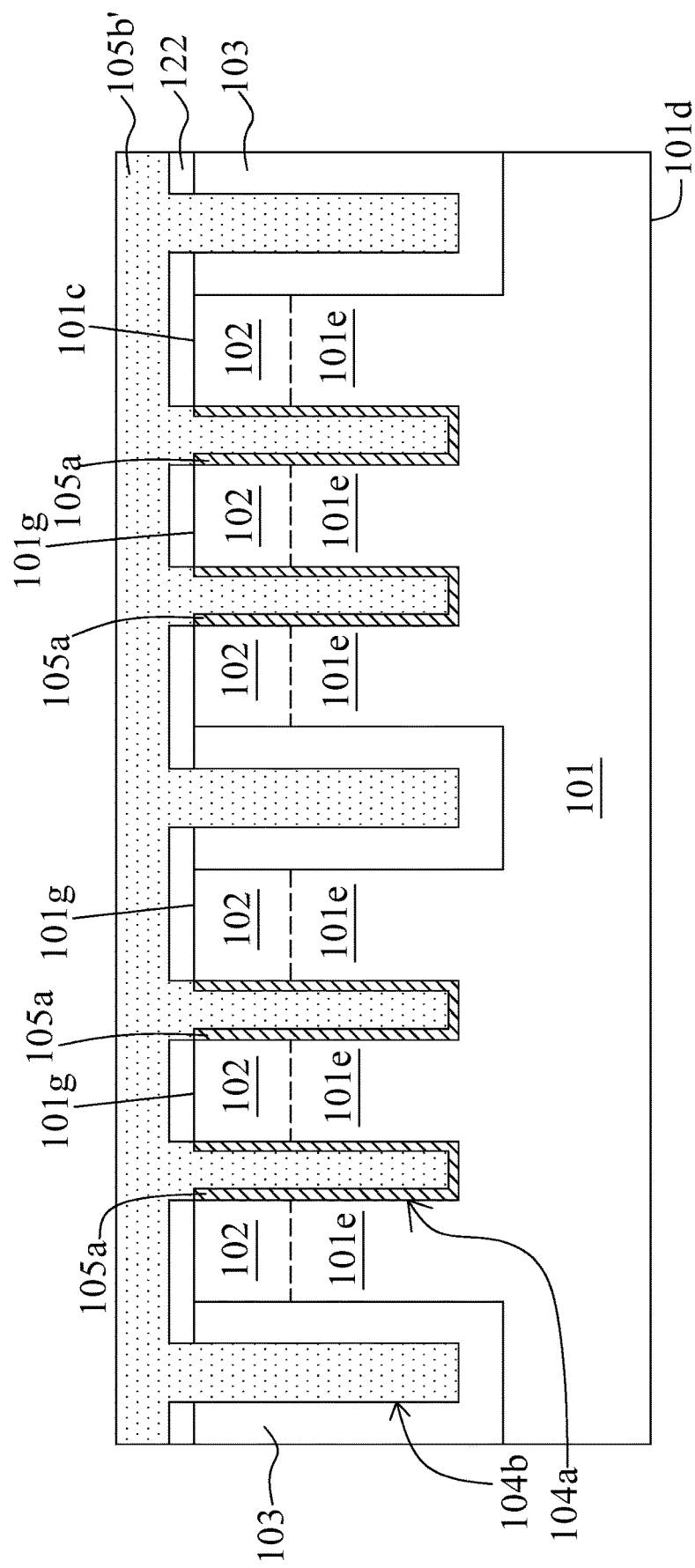
Figure 16:
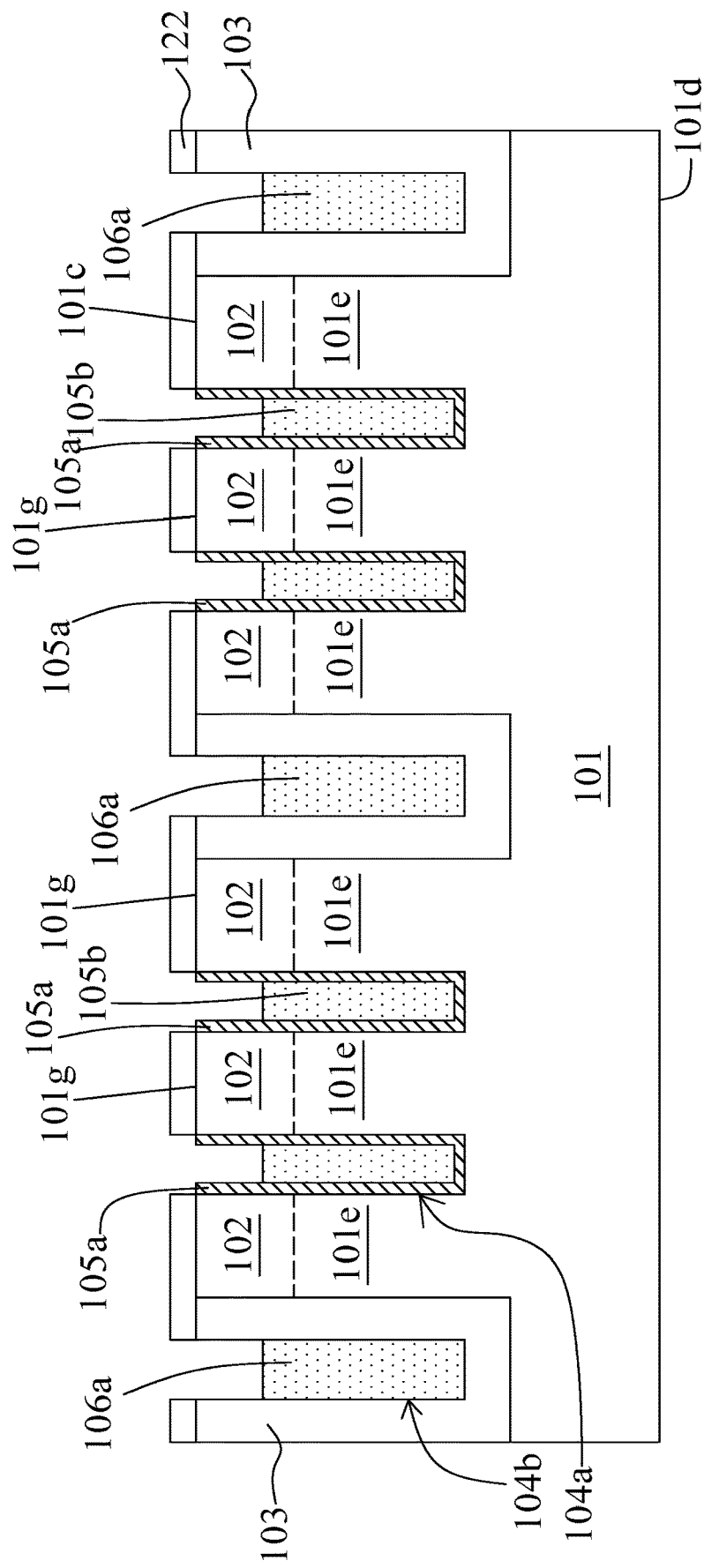

Referring to FIGS. 15 and 16, a first conductive member 105b is formed according to step S205 in FIG. 4. In some embodiments, the first conductive member 105b is surrounded by the second dielectric layer 105a. In some embodiments, the formation of the first conductive member 105b includes disposing a conductive material 105b' into the first recesses 104a and over the first dielectric layer 122 and the second dielectric layer 105a as shown in FIG. 15, and then removing portions of the conductive material 105b' over the first dielectric layer 122 and within the first recesses 104a as shown in FIG. 16. In some embodiments, at least a small amount of the second dielectric layer 105a is exposed through the conductive material 105b' after the removal of the portions of the conductive material 105b'. In some embodiments, at least a small amount of the conductive material 105b' is surrounded by the active areas 102 after the removal of the portions of the conductive material 105b'. In some embodiments, the conductive material 105b' includes tungsten or the like. In some embodiments, the conductive material 105b' is disposed by deposition or any other suitable process. In some embodiments, the portions of the conductive material 105b' are removed by etching back or any other suitable process.

In some embodiments, a second conductive member 106a is formed as shown in FIG. 16. In some embodiments, the second conductive member 106a is formed within the second recess 104b and surrounded by the isolation 103. In some embodiments, the formation of the second conductive member 106a includes disposing the conductive material 105b' into the second recesses 104b and over the first dielectric layer 122 as shown in FIG. 15, and then removing the portions of the conductive material 105b' over the first dielectric layer 122 and portions of the conductive material 105b' within the second recesses 104b as shown in FIG. 16.

In some embodiments, the first conductive member 105b and the second conductive member 106a are formed separately or simultaneously.

Figure 17:
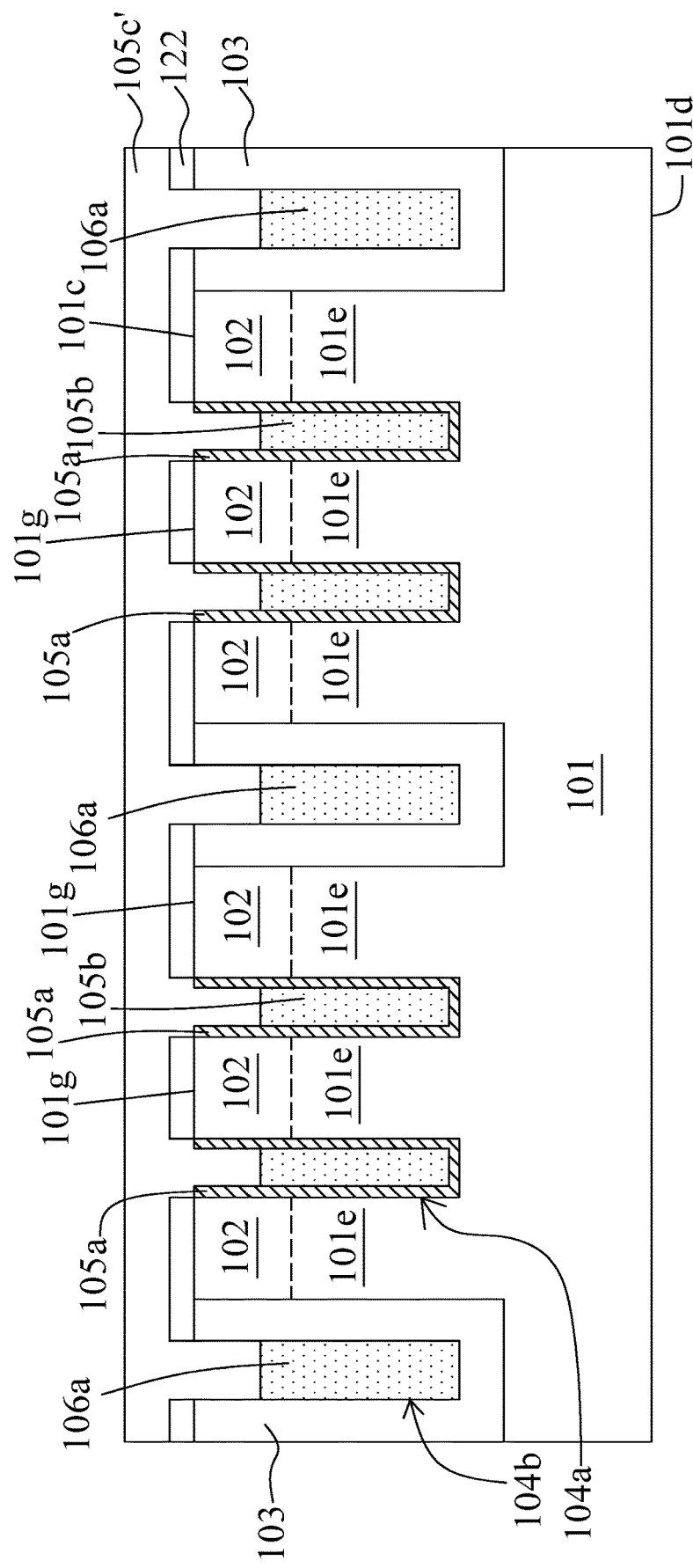
Figure 18:
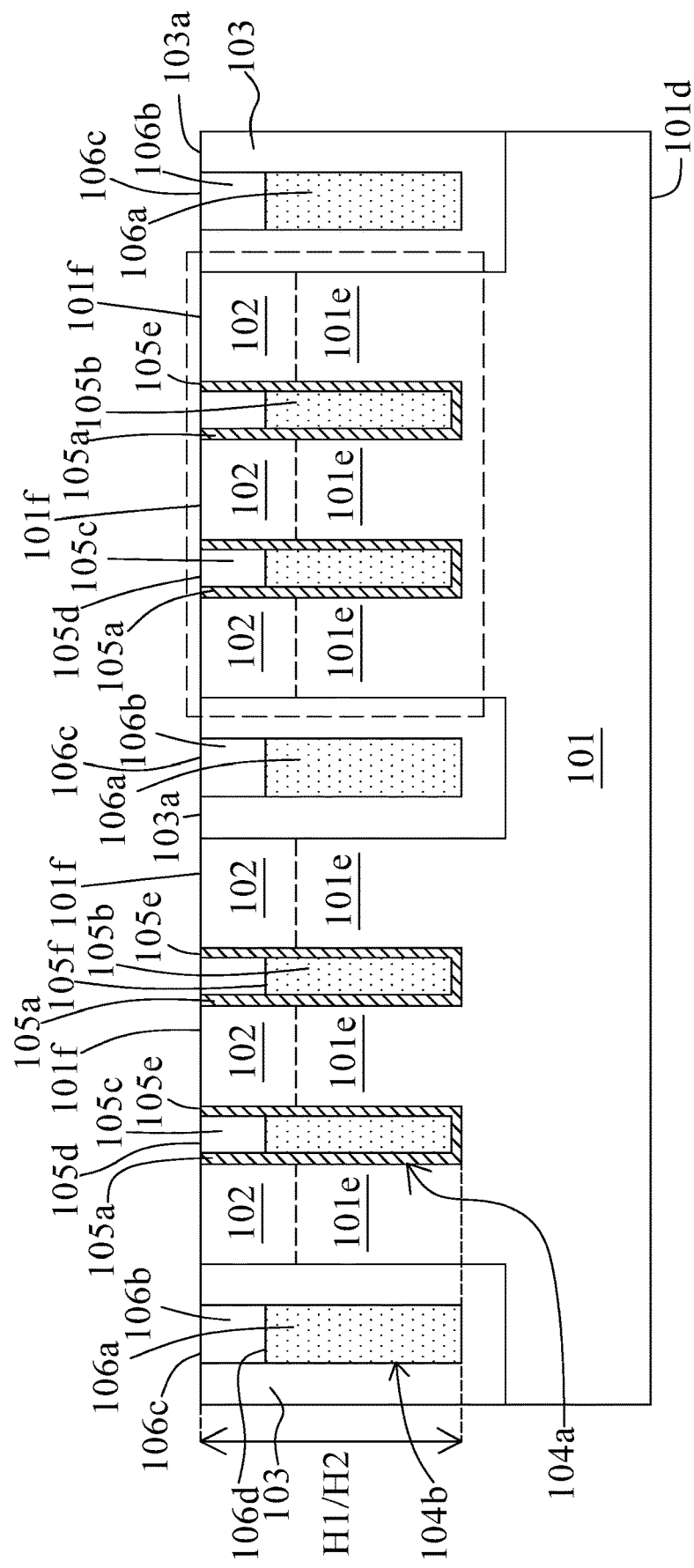

Referring to FIGS. 17 and 18, a third dielectric layer 105c is formed over the first conductive member 105b and surrounded by the second dielectric layer 105a according to step S206 in FIG. 4. In some embodiments, the third dielectric layer 105c is formed over the first conductive member 105b and at least partially within the first recess 104a. In some embodiments, the third dielectric layer 105c is a nitride layer. In some embodiments, the formation of the third dielectric layer 105c includes disposing a dielectric material 105c' within the first recess 104a and over the first dielectric layer 122 and the first conductive member 105b as shown in FIG. 17, and then removing portions of the dielectric material 105c' that are outside of the first recess 104a as shown in FIG. 18. In some embodiments, the dielectric material 105c' is disposed by deposition or any other suitable process. In some embodiments, the portions of the dielectric material 105c' are removed by planarization, chemical mechanical polishing (CMP) or any other suitable process.

In some embodiments, a fourth dielectric layer 106b is formed over the second conductive member 106a and at least partially within the second recess 104b. In some embodiments, the fourth dielectric layer 106b is a nitride layer. In some embodiments, the formation of the fourth dielectric layer 106b includes disposing the dielectric material 105c' within the second recess 104b and over the first dielectric layer 122 and the second conductive member 106a as shown in FIG. 17, and then removing portions of the dielectric material 105c' that are outside of the second recess 104b as shown in FIG. 18. In some embodiments, the third dielectric layer 105c and the fourth dielectric layer 106b are formed simultaneously.

Figure 19:
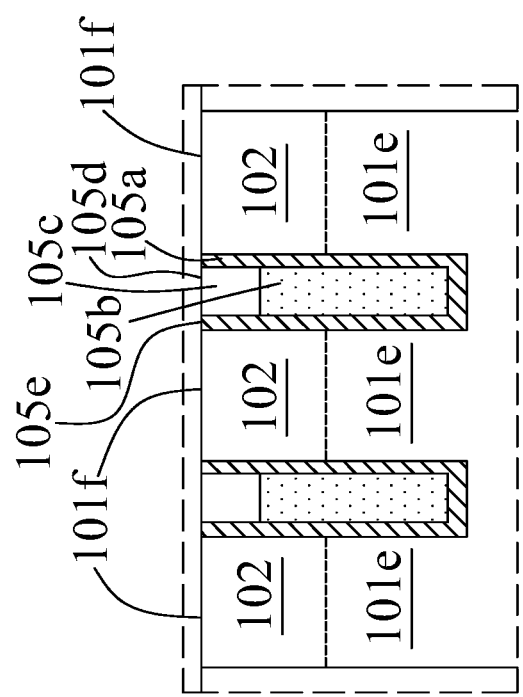

Referring to FIGS. 18 and 19, a portion of the second dielectric layer 105a, the first dielectric layer 122 and the rounded top surfaces 101g of the fins 101e are removed according to step S207 in FIG. 4.

In some embodiments, planar top surfaces 101f of the fins 101e are formed as shown in FIG. 19 after the removal of the rounded top surfaces 101g of the fins. In some embodiments, the planar top surface 101f of the fin 101e is substantially lower than the rounded top surface 101g of the fin 101e. In some embodiments, the height H1 of the fin 101e is reduced after the removal of the rounded top surface 101g of the fin 101e. In some embodiments, a length of the rounded top surface 101g is greater than a length of the planar top surface 101f.

In some embodiments, the rounded top surfaces 101g and the portions of the dielectric material 105c' (as shown in FIG. 17) are removed simultaneously, such that the planar top surfaces 101f and the third dielectric layer 105c are formed simultaneously. In some embodiments, the removal of the first dielectric layer 122, the portion of the second dielectric layer 105a, and the rounded top surfaces 101g of the fins 101e includes planarization or CMP.

In some embodiments, a second top surface 105d is also formed after the formation of the third dielectric layer 105c. In some embodiments, the second top surface 105d is a planar surface and is substantially coplanar with the planar top surface 101f of the fin 101e. In some embodiments, a third top surface 105e is formed after the removal of the portion of the second dielectric layer 105a. In some embodiments, the third top surface 105e is a planar surface and is substantially coplanar with the planar top surface 101f of the fin 101e and the second top surface 105d.

In some embodiments, a portion of the isolation 103 is also removed to form a fourth top surface 103a as shown in FIG. 18. In some embodiments, the removal of the portion of the isolation 103 and the removal of the rounded top surface 101g are performed simultaneously. In some embodiments, the fourth top surface 103a is a planar surface and is substantially coplanar with the planar top surface 101f of the fin 101e, the second top surface 105d and the third top surface 105e.

In some embodiments, a fifth top surface 106c is formed after the formation of the fourth dielectric layer 106b. In some embodiments, the removal of the portion of the isolation 103 and the formation of the fourth dielectric layer 106b are performed simultaneously. In some embodiments, the fifth top surface 106c is a planar surface and is substantially coplanar with the planar top surface 101f of the fin 101e, the second top surface 105d, the third top surface 105e and the fourth top surface 103a. In some embodiments, a first interface 105f between the first conductive member 105b and the third dielectric layer 105c is substantially coplanar with a second interface 106d between the second conductive member 106a and the fourth dielectric layer 106b.

Figure 20:
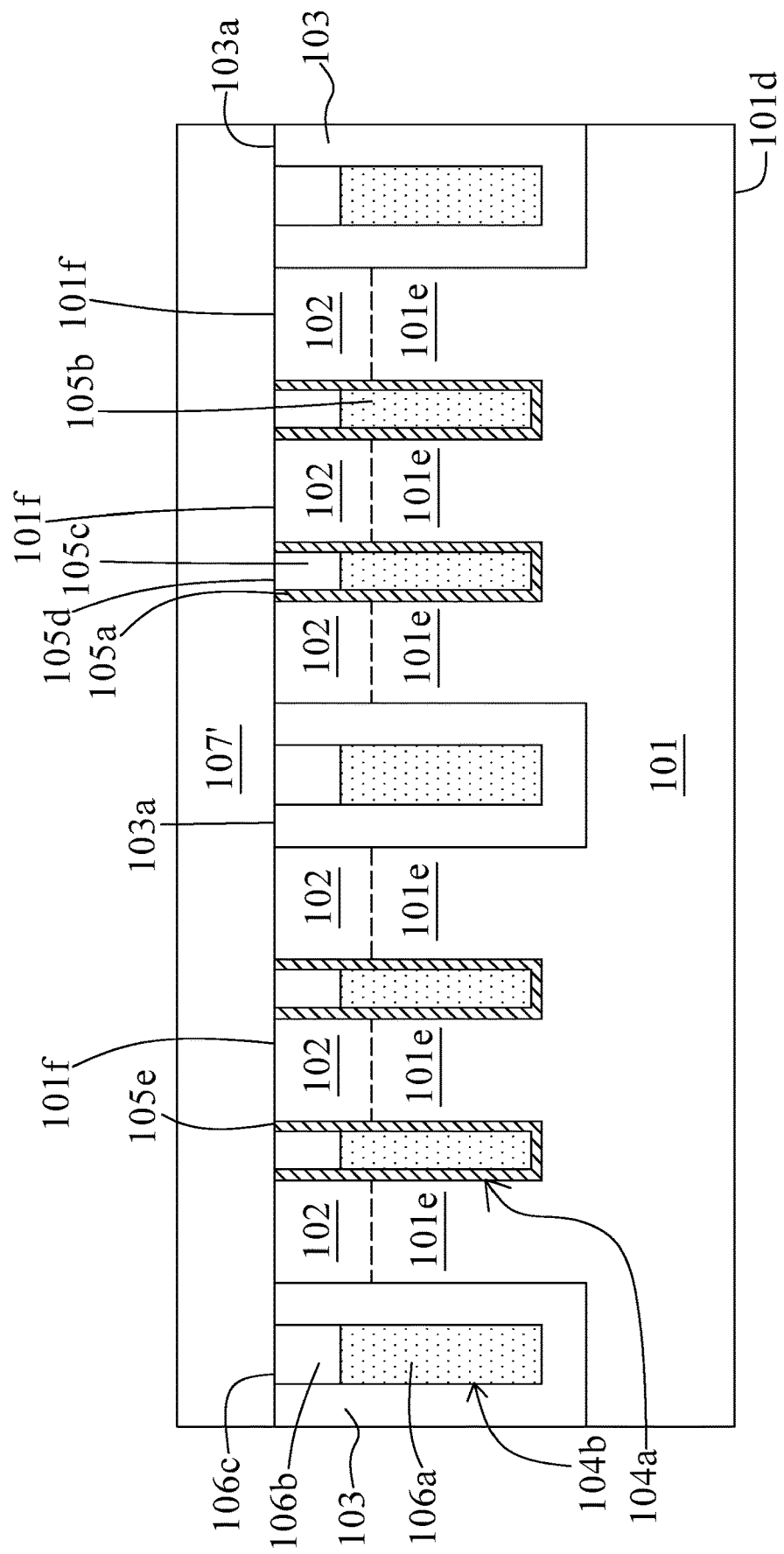
Figure 21:
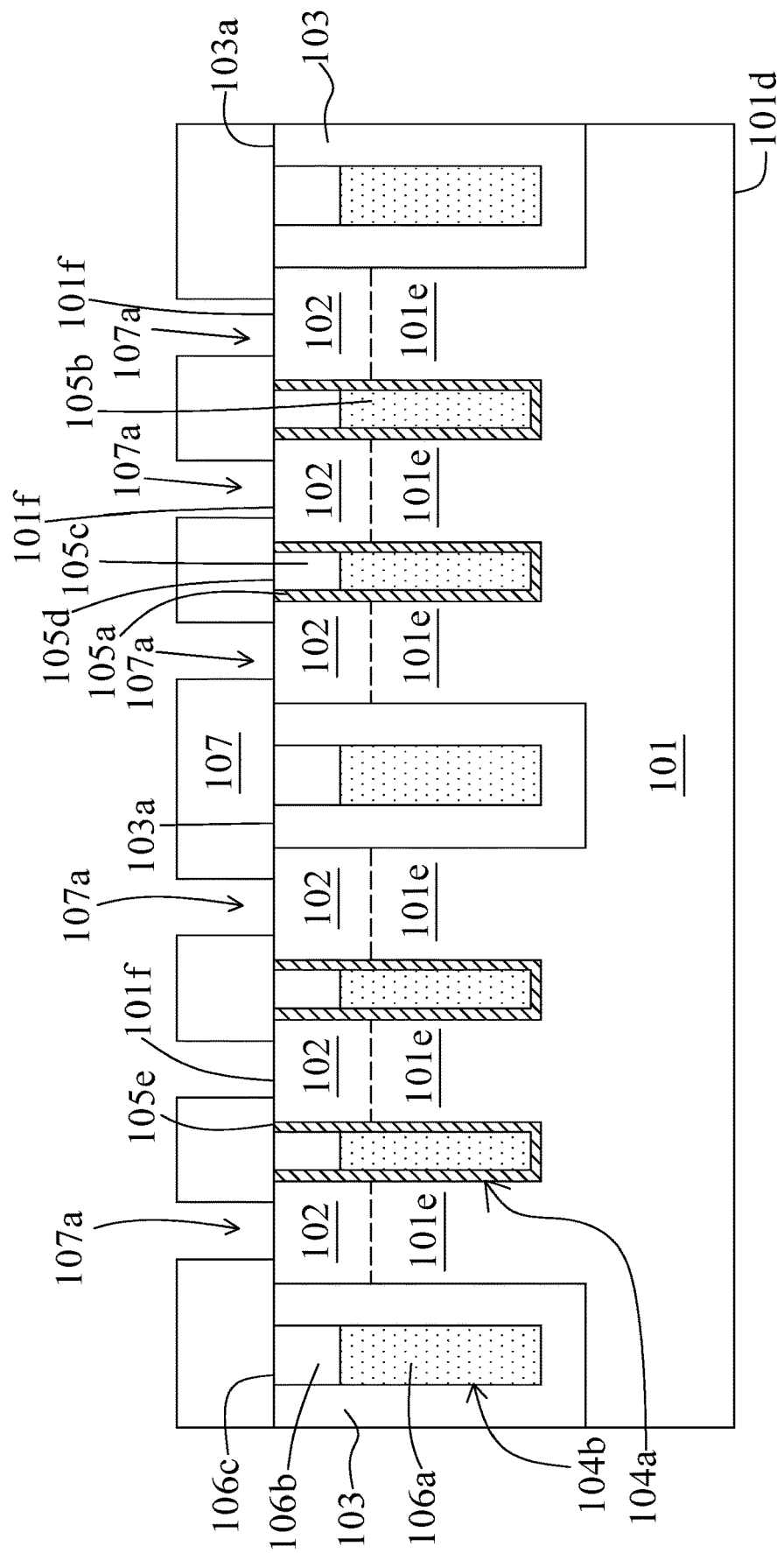

Referring to FIGS. 20 and 21, after the formation of the planar top surface 101f, an insulating layer 107 is formed. In some embodiments, the insulating layer 107 is formed by disposing an insulating material 107' over the fins 101e, the isolations 103, the second dielectric layer 105a, the third dielectric layer 105c and the fourth dielectric layer 106b, as shown in FIG. 20, and then removing portions of the insulating material 107' to form several third recesses 107a extending through the insulating layer 107 as shown in FIG. 21. In some embodiments, at least a portion of the planar top surface 101f of the fin 101e is exposed through the insulating layer 107. In some embodiments, the insulating material 107' includes insulating material such as oxide, nitride or the like.

Figure 22:
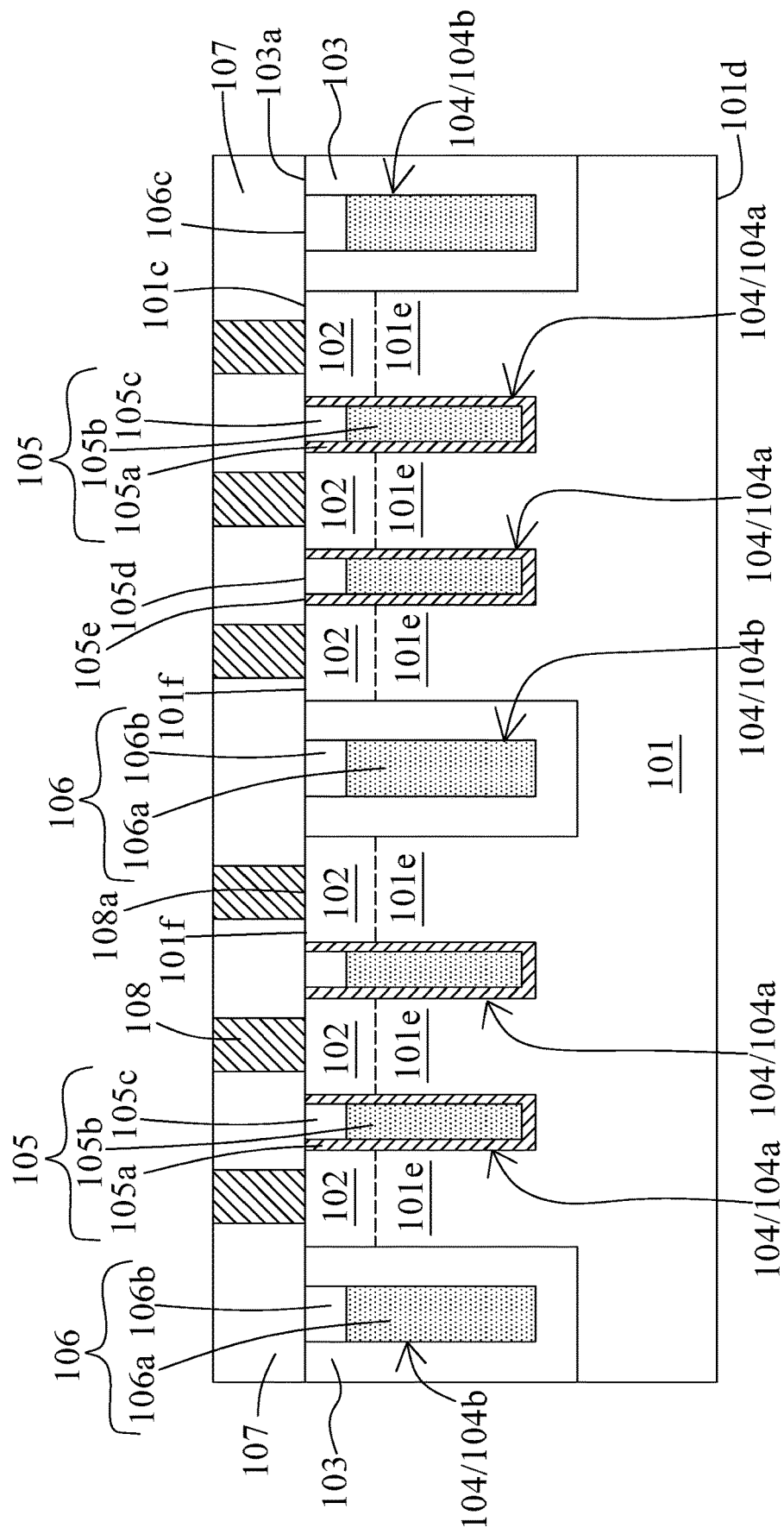

Referring to FIG. 22, after the formation of the insulating layer 107, a conductive plug 108 is formed. In some embodiments, the conductive plug 108 extends through the insulating layer 107 and contacts the planar top surface 101f of the fin 101e. In some embodiments, the conductive plug 108 is formed by disposing a conductive material into the third recess 107a. In some embodiments, the conductive material includes copper, silver or the like. In some embodiments, the conductive material is disposed by deposition, electroplating or any other suitable process. In some embodiments, a planar interface 108a between the conductive plug 108 and the planar top surface 101f of the fin 101e is formed. In some embodiments, the memory device 100 as shown in FIG. 3 is formed. In some embodiments, a cell capacitor is disposed above and electrically connected to the conductive plug 108.

One aspect of the present disclosure provides a method for manufacturing a memory device. The method includes providing a semiconductor substrate defined with a plurality of active areas and including an isolation surrounding each of the plurality of active areas; disposing and patterning a first dielectric layer over the semiconductor substrate and the isolation; removing portions of the semiconductor substrate exposed through the first dielectric layer to form a plurality of first recesses extending into the semiconductor substrate, thereby forming a plurality of fins protruding from the semiconductor substrate; forming a second dielectric layer conformal to each of the plurality of first recesses and surrounding the plurality of fins, wherein each of the plurality of fins has a first top surface after the formation of the second dielectric layer, and the first top surface is a rounded surface; forming a first conductive member within each of the plurality of first recesses and surrounded by the second dielectric layer; forming a third dielectric layer over the first conductive member and surrounded by the second dielectric layer; and removing the first dielectric layer, a portion of the second dielectric layer and the first top surfaces of the plurality of fins, thereby forming a second top surface of each of the plurality of fins, wherein the second top surface is a planar surface.

In some embodiments, the removal of the first dielectric layer, the portion of the second dielectric layer, and the first top surfaces of the plurality of fins includes planarization or chemical mechanical polishing (CMP).

In some embodiments, a portion of the second dielectric layer is disposed between the first dielectric layer and the first top surfaces of the plurality of fins.

In some embodiments, the first top surface of each of the plurality of fins is a convex surface.

In some embodiments, the second top surface of each of the plurality of fins is substantially lower than the first top surface of each of the plurality of fins.

In some embodiments, the first top surface of each of the plurality of fins is curved toward the first dielectric layer.

In some embodiments, the formation of the second dielectric layer includes thermal oxidation.

In some embodiments, the formation of the second dielectric layer includes consuming surfaces of the plurality of fins exposed through the plurality of first recesses.

In some embodiments, the second dielectric layer contacts the plurality of fins exposed through the plurality of first recesses.

In some embodiments, the removal of the portions of the semiconductor substrate includes dry etching.

In some embodiments, the formation of the first conductive member includes disposing a conductive material into the plurality of first recesses and over the first dielectric layer and the second dielectric layer, and removing portions of the conductive material over the first dielectric layer and within the plurality of first recesses.

In some embodiments, at least a portion of the second dielectric layer is exposed through the first conductive member after the removal of the portions of the conductive material.

In some embodiments, at least a portion of the conductive material is surrounded by the plurality of active areas after the removal of the portions of the conductive material.

In some embodiments, the method further includes removing a portion of the isolation to form a second recess extending into the isolation; forming a second conductive member within the second recess and surrounded by the isolation; and forming a fourth dielectric layer over the second conductive member and surrounded by the isolation.

In some embodiments, the first conductive member and the second conductive member are formed simultaneously.

In some embodiments, the fourth dielectric layer is disposed over the second conductive member and at least partially within the second recess.

In some embodiments, a first interface between the first conductive member and the third dielectric layer is substantially coplanar with a second interface between the second conductive member and the fourth dielectric layer.

In some embodiments, the plurality of fins and the plurality of first recesses are alternately disposed.

Another aspect of the present disclosure provides a method for manufacturing a memory device. The method includes providing a semiconductor substrate defined with an active area and including an isolation surrounding the active area; removing portions of the semiconductor substrate to form a plurality of fins protruding from the semiconductor substrate; forming an oxide layer surrounding each of the plurality of fins, thereby forming a rounded top surface of each of the plurality of fins; forming a conductive member surrounding the plurality of fins and surrounded by the oxide layer; forming a nitride layer over the conductive member and surrounded by the oxide layer; and removing portions of the oxide layer and the rounded top surfaces of plurality of fins, thereby forming a planar top surface of each of the plurality of fins.

In some embodiments, the formation of the oxide layer includes oxidizing surfaces of the plurality of fins.

In some embodiments, a width of each of the plurality of fins is reduced after the formation of the oxide layer.

In some embodiments, a height of each of the plurality of fins is reduced after the removal of the rounded top surfaces of the plurality of fins.

In some embodiments, the conductive member includes tungsten.

In some embodiments, the method further includes forming an insulating layer over the planar top surfaces of the plurality of fins, the oxide layer and the nitride layer; and forming a conductive plug extending through the insulating layer and contacting the planar top surface of one of the plurality of fins.

In some embodiments, a planar interface between the conductive plug and the planar top surface of the one of the plurality of fins is formed.

In some embodiments, the rounded top surface of each of the plurality of fins is longer than the planar top surface of each of the plurality of fins.

Another aspect of the present disclosure provides a memory device. The memory device includes a semiconductor substrate defined with an active area and including a plurality of fins protruding from the semiconductor substrate and disposed within the active area, wherein each of the plurality of fins has a first planar top surface; a first word line extending into the semiconductor substrate and between an adjacent two of the plurality of fins, wherein the first word line includes an oxide layer conformal to surfaces of the adjacent two of the plurality of fins, a first conductive member surrounded by the oxide layer, and a first nitride layer disposed over the first conductive member and surrounded by the oxide layer; and an isolation extending into the semiconductor substrate and surrounding the active area, wherein the first nitride layer has a second planar top surface substantially coplanar with the first planar top surface of each of the plurality of fins.

In some embodiments, the oxide layer has a third planar top surface substantially coplanar with the first planar top surface of each of the plurality of fins and the second planar top surface of the first nitride layer.

In some embodiments, the third planar top surface of the oxide layer is coupled with the first planar top surface of one of the plurality of fins and the second planar top surface of the first nitride layer.

In some embodiments, the memory device further includes an insulating layer disposed over the semiconductor substrate and the isolation, and a conductive plug extending through the insulating layer and contacting the first planar top surface of one of the plurality of fins.

In some embodiments, a planar interface is disposed between the conductive plug and the first planar top surface of one of the plurality of fins.

In some embodiments, the isolation has a fourth planar top surface substantially coplanar with the first planar top surface of each of the plurality of fins.

In some embodiments, a second word line is disposed within the isolation.

In some embodiments, the second word line is separated from the first word line by the plurality of fins.

In some embodiments, a height of the second word line is substantially greater than a height of the first word line.

In conclusion, because a top portion of each of fins protruding from a substrate is planarized prior to a formation of a contact between a cell capacitor and each of the fins, a contact area between the cell capacitor and each fin is enlarged by planarizing the top portion, so that a curved surface of the top portion becomes a planar surface. Therefore, an overall performance of a memory device and a process of manufacturing the memory device are improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for manufacturing a memory device, comprising:
   providing a semiconductor substrate defined with a plurality of active areas and including an isolation surrounding each of the plurality of active areas;
   disposing and patterning a first dielectric layer over the semiconductor substrate and the isolation;
   removing portions of the semiconductor substrate exposed through the first dielectric layer to form a plurality of first recesses extending into the semiconductor substrate, thereby forming a plurality of fins protruding from the semiconductor substrate;
   forming a second dielectric layer conformal to each of the plurality of first recesses and surrounding the plurality of fins, wherein the second dielectric layer is formed on a bottom and sidewalls of each of the plurality of first recesses only, wherein each of the plurality of fins has a first top surface is uncovered by the second dielectric layer after the formation of the second dielectric layer, and the first top surface is a rounded surface, wherein the second dielectric layer is in contact with the first top surface of each of the plurality of fins;
   forming a first conductive member within each of the plurality of first recesses and surrounded by the second dielectric layer;

forming a third dielectric layer over the first conductive member and surrounded by the second dielectric layer; and concurrently removing the first dielectric layer, a portion of the second dielectric layer and the round surfaces of the plurality of fins, thereby forming a second top surface of each of the plurality of fins, wherein the second top surface is a planar surface.

2. The method according to claim 1, wherein the removal of the first dielectric layer, the portion of the second dielectric layer, and the first top surfaces of the plurality of fins includes planarization or chemical mechanical polishing (CMP).

3. The method according to claim 1, wherein a portion of the second dielectric layer is disposed between the first dielectric layer and the first top surfaces of the plurality of fins, wherein the second dielectric layer is an oxide layer only formed on surfaces of the plurality of fins exposed through the plurality of first recesses.

4. The method according to claim 1, wherein the first top surface of each of the plurality of fins is a convex surface.

5. The method according to claim 1, wherein the second top surface of each of the plurality of fins is substantially lower than the first top surface each of the plurality of fins.

6. The method according to claim 1, wherein the first top surface of each of the plurality of fins is curved toward the first dielectric layer.

7. The method according to claim 1, wherein the formation of the second dielectric layer includes thermal oxidation, wherein the third dielectric layer is a nitride layer and is formed by:
disposing a dielectric material within the plurality of first recesses, and over the first dielectric layer and the first conductive member; and
removing portions of the dielectric material outside of the plurality of the first recesses.

8. The method according to claim 1, wherein the formation of the second dielectric layer includes consuming surfaces of the plurality of fins exposed through the plurality of first recesses.

9. The method according to claim 1, wherein the second dielectric layer contacts the plurality of fins exposed through the plurality of first recesses.

10. The method according to claim 1, wherein the removal of the portions of the semiconductor substrate includes dry etching.

11. The method according to claim 1, wherein the formation of the first conductive member includes disposing a conductive material into the plurality of first recesses and over the first dielectric layer and the second dielectric layer, and removing portions of the conductive material over the first dielectric layer and within the plurality of first recesses.

12. The method according to claim 11, wherein at least a portion of the second dielectric layer is exposed through the first conductive member after the removal of the portions of the conductive material.

13. The method according to claim 11, wherein at least a portion of the conductive material is surrounded by the plurality of active areas after the removal of the portions of the conductive material.

14. The method according to claim 1, further comprising:
removing a portion of the isolation to form a second recess extending into the isolation;
forming a second conductive member within the second recess and surrounded by the isolation; and
forming a fourth dielectric layer over the second conductive member and surrounded by the isolation;
wherein the second recess is free of the second dielectric layer, such that the second dielectric layer is only formed within the plurality of first recesses.

15. The method according to claim 14, wherein the first conductive member and the second conductive member are formed simultaneously.

16. The method according to claim 14, wherein the fourth dielectric layer is disposed over the second conductive member and at least partially within the second recess, wherein a depth of the second recess is larger than a depth of each of the plurality of first recesses after the second dielectric layer is formed therein.

17. The method according to claim 16, wherein a first interface between the first conductive member and the third dielectric layer is substantially coplanar with a second interface between the second conductive member and the fourth dielectric layer.

18. The method according to claim 1, wherein the plurality of fins and the plurality of first recesses are alternately disposed.

* * * * *